US012796255B2

(12) United States Patent
Lee et al.

(10) Patent No.: US 12,796,255 B2

(45) Date of Patent: Nov. 10, 2026

(54) DISPLAY DEVICE AND ELECTRONIC DEVICE INCLUDING THE SAME

(71) Applicant: Samsung Display Co., Ltd., Yongin-si (KR)

(72) Inventors: Yong Hee Lee, Yongin-si (KR); Dong Woo Kim, Yongin-si (KR); Yeon Kyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/214,929

(22) Filed: May 21, 2025

(65) Prior Publication Data

US 2026/0013351 A1 Jan. 8, 2026

(30) Foreign Application Priority Data

Jul. 4, 2024 (KR) ........................ 10-2024-0088290

(51) Int. Cl.

*H10K 59/131* (2023.01)

*G09G 3/3233* (2016.01)

(52) U.S. Cl.

CPC ......... *H10K 59/131* (2023.02); *G09G 3/3233* (2013.01); *G09G 2300/0426* (2013.01); *G09G 2300/0819* (2013.01); *G09G 2300/0852* (2013.01); *G09G 2300/0861* (2013.01)

(58) Field of Classification Search

CPC ............. H10K 59/131; H10K 59/1213; G09G 3/3233; G09G 2300/0426; G09G 2300/0819; G09G 2300/0852; G09G 2300/0861; G09G 2320/0209

See application file for complete search history.

(56) References Cited

U.S. PATENT DOCUMENTS

| | | | | |
|---|---|---|---|---|
| 11,176,883 | B2 | 11/2021 | Na et al. | |
| 11,348,992 | B2 | 5/2022 | Oh et al. | |
| 11,875,746 | B2 * | 1/2024 | Cho | H10K 71/80 |
| 11,908,872 | B2 | 2/2024 | Cho et al. | |

FOREIGN PATENT DOCUMENTS

| | | | | |
|---|---|---|---|---|
| EP | 4362632 | A1 * | 5/2024 | H10D 86/60 |
| KR | 10-2020-0145960 | A | 12/2020 | |
| KR | 10-2022-0060606 | A | 5/2022 | |
| KR | 10-2698949 | B1 | 8/2024 | |

* cited by examiner

*Primary Examiner* — Nitin Patel

*Assistant Examiner* — Gloryvid Figueroa-Gibson

(74) *Attorney, Agent, or Firm* — Womble Bond Dickinson (US) LLP

(57) ABSTRACT

A display device and an electronic device including the same are provided, and the display device may include a substrate, sub-pixels having first and second sub-pixels adjacent to each other, a pixel-circuit layer including a sub-pixel circuit including a first sub-pixel circuit in the first sub-pixel and a second sub-pixel circuit in the second sub-pixel above the substrate, and the first and second sub-pixel circuits including a driving transistor, and a switching transistor having a first electrode electrically connected to a gate electrode of the driving transistor through a first node portion, and a second electrode electrically connected to a data line through a second node portion, and an intermediate member between the first node portion of the first sub-pixel circuit and the second node portion of the second sub-pixel circuit in plan view, and a light-emitting element above the pixel-circuit layer, and electrically connected to the sub-pixel circuit.

16 Claims, 28 Drawing Sheets

DISPLAY DEVICE AND ELECTRONIC DEVICE INCLUDING THE SAME

CROSS-REFERENCE TO RELATED APPLICATION

The present application claims priority to, and the benefit of, Korean Patent Application No. 10-2024-0088290, filed on Jul. 4, 2024, in the Korean Intellectual Property Office, the entire disclosure of which is incorporated herein by reference.

BACKGROUND

1. Field of Invention

Various embodiments of the present disclosure relate to a display device.

2. Description of Related Art

Recently, as interest in information display increases, research and development on display devices have been continuously conducted.

Display devices may include a light-emitting element configured to emit light, and a pixel circuit configured to operate the light-emitting element. Electrical signals for operating the light-emitting element may be provided from the pixel circuit designed with two or more electrode patterns. The electrical signals may interfere with each other, thus leading to risks such as crosstalk, which can degrade display quality. Accordingly, to provide a high-quality display device, an electrode structure with improved reliability of electrical signals is required.

SUMMARY

An aspect of the present disclosure is directed to a display device with improved reliability of electrical signals, thereby reducing risks such as crosstalk between the signals.

An aspect of the present disclosure is directed to a display device that has enhanced display quality with improved reliability and is capable of having high-resolution characteristics.

One or more embodiments of the present disclosure may provide a display device including a substrate, sub-pixels having a first sub-pixel and a second sub-pixel adjacent to each other, a pixel-circuit layer including a sub-pixel circuit including a first sub-pixel circuit in the first sub-pixel and a second sub-pixel circuit in the second sub-pixel above the substrate, and the first sub-pixel circuit and the second sub-pixel circuit each including a driving transistor, and a switching transistor having a first electrode electrically connected to a gate electrode of the driving transistor through a first node portion, and a second electrode electrically connected to a data line through a second node portion, and an intermediate member between the first node portion of the first sub-pixel circuit and the second node portion of the second sub-pixel circuit in a plan view, and a light-emitting element above the pixel-circuit layer, and electrically connected to the sub-pixel circuit.

The first sub-pixel circuit and the second sub-pixel circuit may be adjacent to each other in a first direction, wherein, in the first sub-pixel circuit and in the second sub-pixel circuit, the driving transistor and the switching transistor are adjacent to each other in a second direction that is different from the first direction, wherein the driving transistor of the first sub-pixel circuit and the driving transistor of the second sub-pixel circuit face each other in the first direction, and wherein the switching transistor of the first sub-pixel circuit and the switching transistor of the second sub-pixel circuit face each other in the first direction.

The intermediate member may extend in the second direction.

The display device may further include a conductive connection line electrically connected to the intermediate member, and configured to supply an electrical signal that is different from electrical signals configured to be respectively received by the first node portion and the second node portion.

The pixel-circuit layer may include conductive layers and conductive structure layers above the substrate and respectively including the sub-pixel circuit, the data line, and the intermediate member.

The intermediate member may be at a same layer as the first node portion and the second node portion.

The conductive layers may include a first conductive layer including the intermediate member, at least a portion of the first node portion, and at least a portion of the second node portion, and a second conductive layer above the first conductive layer and including a bridge layer, wherein the second node portion is electrically connected to the data line through the bridge layer.

The pixel-circuit layer may further include a first power line configured to receive a first power voltage, a second power line configured to receive a second power voltage, a third power line configured to receive an initialization voltage, a fourth power line, a first sub-gate line electrically connected to a gate electrode of the switching transistor, a second sub-gate line, and an emission control line, wherein the sub-pixel circuit further includes a third transistor connected between a first node and the first power line, and including a gate electrode electrically connected to the emission control line, and a fourth transistor connected between a second node and the third power line, and including a gate electrode electrically connected to the second sub-gate line, wherein the driving transistor is connected between the first node and the second node, and wherein the light-emitting element is connected between the second node and the second power line.

The intermediate member may be electrically connected to, and extending in a different direction than, the first sub-gate line.

The first conductive layer may include the first sub-gate line that is integral with the intermediate member.

The intermediate member may be electrically connected to, and may extend in a different direction than, the second sub-gate line.

The intermediate member may overlap the driving transistor and the fourth transistor in the first direction.

The intermediate member may be configured to receive a direct current (DC) signal.

The intermediate member may be electrically connected to the first power line.

The sub-pixel circuit may include a first capacitor connected between the first node and the first node portion, a second capacitor connected between the first node portion and the fourth power line, which is configured to receive a reference voltage, and a third capacitor connected between the second node and the first node portion, wherein the conductive structure layers form capacitance for the first capacitor, the second capacitor, and the third capacitor.

One or more embodiments of the present disclosure may provide a display device including sub-pixels having a first sub-pixel and a second sub-pixel adjacent to each other, the display device including a pixel-circuit layer including a sub-pixel circuit above a substrate, and including a driving transistor, and a switching transistor having a first electrode electrically connected to a gate electrode of the driving transistor through a first node portion, and a second electrode electrically connected to a data line through a second node portion, and a cover layer having at least a portion between the first node portion and the second node portion in an overlapping area at which the first node portion and the second node portion overlap in a plan view, and a light-emitting element above the pixel-circuit layer, and electrically connected to the sub-pixel circuit.

The display device may further include a conductive connection line electrically connected to the cover layer, and configured to supply an electrical signal that is different from electrical signals configured to be respectively received by the first node portion and the second node portion.

The cover layer and the conductive connection line may be integral.

The cover layer and the conductive connection line may be electrically connected to each other through a contact member passing through an interlayer insulating layer between the cover layer and the conductive connection line.

The cover layer may include a first cover layer and a second cover layer at different respective layers.

One or more embodiments of the present disclosure may provide an electronic device including a display device including a substrate, sub-pixels having a first sub-pixel and a second sub-pixel adjacent to each other, a pixel-circuit layer including a sub-pixel circuit including a first sub-pixel circuit in the first sub-pixel and a second sub-pixel circuit in the second sub-pixel above the substrate, and the first sub-pixel circuit and the second sub-pixel circuit each including a driving transistor, and a switching transistor having a first electrode electrically connected to a gate electrode of the driving transistor through a first node portion, and a second electrode electrically connected to a data line through a second node portion, and an intermediate member between the first node portion of the first sub-pixel circuit and the second node portion of the second sub-pixel circuit in a plan view, and a light-emitting element above the pixel-circuit layer, and electrically connected to the sub-pixel circuit.

The electronic device may include a smartphone, a television, a monitor, a tablet, an electric vehicle, a mobile phone, a tablet personal computer (PC), a mobile communication terminal, an electronic notebook, an electronic book, a portable multimedia player (PMP), a navigation device, an ultra-mobile PC (UMPC), a laptop computer, a billboard, an Internet of Things (IoT) device, a smartwatch, a watch phone, or a head-mounted display (HMD).

DETAILED DESCRIPTION

Figure 1:
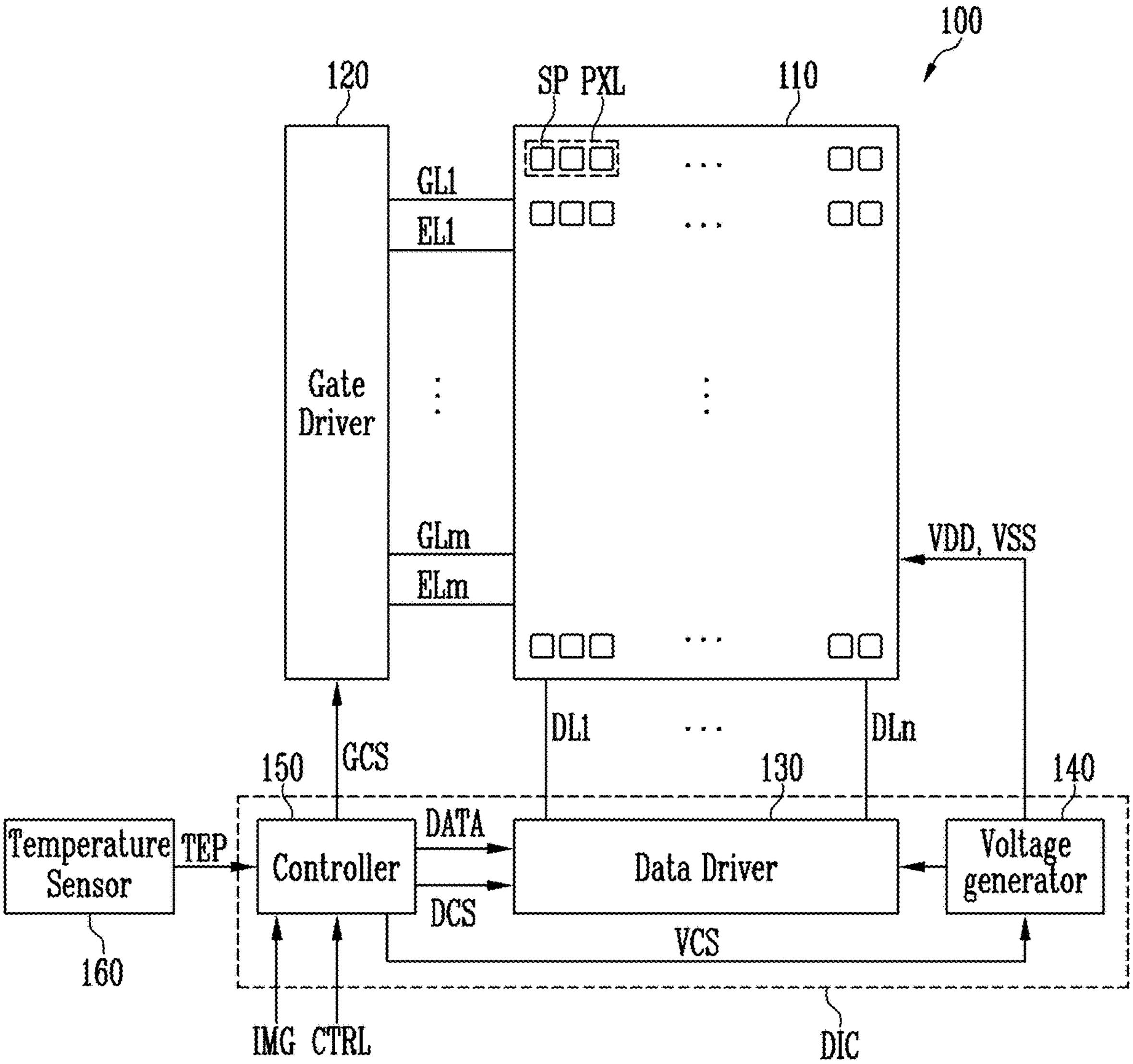
FIG. 1 is a block diagram illustrating one or more embodiments of a display device.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the terms "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure." Furthermore, the expression "being the same" may mean "being substantially the same". In other words, the expression "being the same" may include a range that can be tolerated by those of ordinary skill in the art. The other expressions may also be expressions from which "substantially" has been omitted.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating one or more embodiments of a display device 100.

Referring to FIG. 1, the display device 100 may include a display panel 110, a gate driver 120, a data driver 130, a voltage generator 140, and a controller 150.

The display panel 110 may include sub-pixels SP. The sub-pixels SP may be connected to the gate driver 120 through first to m-th gate lines GL1 to GLm. The sub-pixels SP may be connected to the data driver 130 through first to n-th data lines DL1 to DLn.

Each of the sub-pixels SP may include at least one light-emitting element configured to generate light. Accordingly, each of the sub-pixels SP may generate light in a corresponding color such as red, green, blue, cyan, magenta, or yellow. Two or more sub-pixels SP among the sub-pixels SP may form a pixel PXL. For example, as illustrated in FIG. 1, three sub-pixels SP may form a pixel PXL.

The gate driver 120 may be connected to the sub-pixels SP arranged in a row direction through the first to m-th gate lines GL1 to GLm. The gate driver 120 may output gate signals to the first to m-th gate lines GL1 to GLm in response to a gate control signal GCS. In embodiments, the gate control signal GCS may include a start signal instructing each frame to start, a horizontal synchronization signal for outputting gate signals in synchronization with a timing at which data signals are applied, and the like.

In embodiments, there may be further provided first to m-th emission control lines EL1 to ELm connected to the sub-pixels SP arranged in the row direction. In this case, the gate driver 120 may include an emission control driver configured to control the first to m-th emission control lines EL1 to ELm. The emission control driver may operate under the control of the controller 150.

The gate driver 120 may be located on a side of the display panel 110. However, the embodiments are not limited to the aforementioned example. For example, the gate driver 120 may be divided into two or more drivers that are physically and/or logically distinguished from each other. The drivers may be located on a first side of the display panel 110 and a second side of the display panel 110 opposite to the first side. As such, the gate driver 120 may be located around the display panel 110 in various forms depending on embodiments.

The data driver 130 may be connected to sub-pixels SP arranged in a column direction through the first to n-th data lines DL1 to DLn. The data driver 130 may receive image data DATA and a data control signal DCS from the controller 150. The data driver 130 may operate in response to the data control signal DCS. In embodiments, the data control signal DCS may include a source start pulse, a source shift clock, a source output enable signal, and the like.

The data driver 130 may apply, using voltages from the voltage generator 140, data signals having grayscale voltages corresponding to the image data DATA to the first to n-th data lines DL1 to DLn. When a gate signal is applied to each of the first to m-th gate lines GL1 to GLm, data signals corresponding to the image data DATA may be applied to the data lines DL1 to DLm. Hence, the associated sub-pixels SP may generate light corresponding to the data signals. As a result, an image may be displayed on the display panel 110.

In embodiments, the gate driver 120 and the data driver 130 may include complementary metal-oxide semiconductor (CMOS) circuit elements.

The voltage generator 140 may operate in response to a voltage control signal VCS provided from the controller 150. The voltage generator 140 is configured to generate a plurality of voltages, and to provide the generated voltages to components of the display device 100. For example, the voltage generator 140 may be configured to receive an input voltage from an external device provided outside the display device 100, adjust the received voltage, and regulate the adjusted voltage, thus generating a plurality of voltages.

The voltage generator 140 may generate a first power voltage VDD and a second power voltage VSS. The generated first and second power voltages VDD and VSS may be provided to the sub-pixels SP. The first power voltage VDD may have a relatively high voltage level. The second power voltage VSS may have a voltage level lower than the first power voltage VDD. In other embodiments, the first power voltage VDD or the second power voltage VSS may be provided by an external device of the display device 100.

In addition, the voltage generator 140 may generate various voltages. For example, the voltage generator 140 may generate an initialization voltage to be applied to the sub-pixels SP. For example, during a sensing operation for sensing electrical characteristics of transistors and/or light-emitting elements of the sub-pixels SP, a certain reference voltage may be applied to each of the first to n-th data lines DL1 to DLn. The voltage generator 140 may generate the reference voltage.

The controller 150 may control overall operations of the display device 100. The controller 150 may receive input image data IMG and a control signal CTRL for controlling an operation of displaying the input image data IMG from an external device. The controller 150 may provide a gate control signal GCS, a data control signal DCS, and a voltage control signal VCS, in response to the control signal CTRL.

The controller 150 may convert the input image data IMG to be suitable for the display device 100 or the display panel 110, and then may output image data DATA. In embodiments, the controller 150 may align the input image data IMG to be suitable for the sub-pixels SP on a row basis and then output the image data DATA.

Two or more components of the data driver 130, the voltage generator 140, and the controller 150 may be mounted on a single integrated circuit. As illustrated in FIG. 1, the data driver 130, the voltage generator 140, and the controller 150 may be included in a driver integrated circuit DIC. In this case, the data driver 130, the voltage generator 140, and the controller 150 may be components that are functionally separated from each other in the single driver integrated circuit DIC. In other embodiments, at least one of the data driver 130, the voltage generator 140, and the controller 150 may be provided as a component separate from the driver integrated circuit DIC.

The display device 100 may include at least one temperature sensor 160. The temperature sensor 160 is configured to sense a peripheral temperature and generate temperature data TEP indicating the sensed temperature. In embodiments, the temperature sensor 160 may be located adjacent to the display panel 110 and/or the driver integrated circuit DIC.

The controller 150 may control various operations of the display device 100 in response to the temperature data TEP. In embodiments, the controller 150 may adjust the luminance of an image outputted from the display panel 110 in response to the temperature data TEP. For example, the controller 150 may control components such as the data driver 130 and/or the voltage generator 140, thus adjusting data signals and the first and second power voltages VDD and VSS.

The display device 100 according to one or more embodiments is a device that displays a moving image and/or a still image. The display device 100 may be applied to portable electronic devices such as mobile phones, smartphones, tablet personal computers (PCs), mobile communication terminals, electronic notebooks, electronic books, portable multimedia players (PMPs), navigations, and ultra-mobile PCs (UMPCs). For example, the display device 100 may be applied to a display unit of a television, a laptop computer, a monitor, a billboard, or the Internet of Things (IoT) device. Alternatively, in one or more embodiments, the display device 100 may be applied to a smartwatch, a watch phone, and/or a head-mounted display (HMD) device for implementing virtual reality and/or augmented reality.

Figure 2:
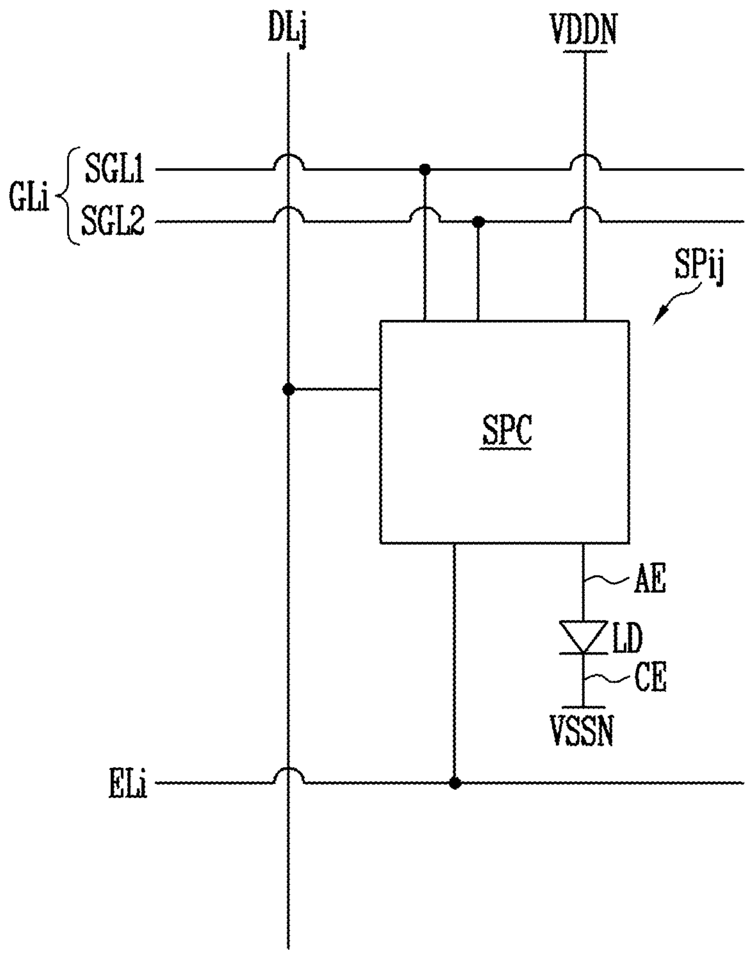
FIG. 2 is a block diagram illustrating one or more embodiments of any one of sub-pixels of FIG. 1.

FIG. 2 is a block diagram illustrating one or more embodiments of any one of the sub-pixels SP of FIG. 1. In FIG. 2, a sub-pixel SPij is illustrated, located on an i-th row (where i is an integer equal to or greater than 1 and less than or equal to m) and a j-th column (where j is an integer equal to or greater than 1 and less than or equal to n) among the sub-pixels SP of FIG. 1.

Referring to FIG. 2, the sub-pixel SPij may include a sub-pixel circuit SPC and a light-emitting element LD.

The light-emitting element LD is connected between a first power voltage node VDDN and a second power voltage node VSSN. Here, the first power voltage node VDDN may be a node provided to transmit the first power voltage VDD of FIG. 1. The second power voltage node VSSN may be a node provided to transmit the second power voltage VSS of FIG. 1.

An anode electrode AE of the light-emitting element LD may be connected to the first power voltage node VDDN through the sub-pixel circuit SPC. A cathode electrode CE of the light-emitting element LD may be connected to the second power voltage node VSSN. For example, the anode electrode AE of the light-emitting element LD may be connected to the first power voltage node VDDN through one or more transistors included in the sub-pixel circuit SPC.

The sub-pixel circuit SPC may be connected to an i-th gate line GLi among the first to m-th gate lines GL1 to GLm of FIG. 1, an i-th emission control line ELi among the first to m-th emission control lines EL1 to ELm of FIG. 1, and a j-th data line DLj among the first to n-th data lines DL1 to DLn of FIG. 1. The sub-pixel circuit SPC is configured to control the light-emitting element LD in response to signals received through the aforementioned signal lines.

The sub-pixel circuit SPC may operate in response to a gate signal received through the i-th gate line GLi. The i-th gate line GLi may include one or more sub-gate lines. In embodiments, as illustrated in FIG. 2, the i-th gate line GLi may include first and second sub-gate lines SGL1 and SGL2. The sub-pixel circuit SPC may operate in response to gate signals received through the first and second sub-gate lines SGL1 and SGL2. As such, in the case where the i-th gate line GLi includes two or more sub-gate lines, the sub-pixel circuit SPC may operate in response to gate signals received through the corresponding sub-gate lines.

The sub-pixel circuit SPC may operate in response to an emission control signal received through the i-th emission control line ELi. In embodiments, the i-th emission control line ELi may include one or more sub-emission control lines. In the case where the i-th emission control line ELi includes two or more sub-emission control lines, the sub-pixel circuit SPC may operate in response to emission control signals received through the corresponding sub-emission control lines.

The sub-pixel circuit SPC may receive a data signal through a j-th data line DLj. The sub-pixel circuit SPC may store a voltage corresponding to the data signal in response to at least one of gate signals received through the first and/or second sub-gate lines SGL1 and/or SGL2. The sub-pixel circuit SPC may adjust current flowing from the first power voltage node VDDN to the second power voltage node VSSN through the light-emitting element LD according to the stored voltage, in response to the emission control signal received through the i-th emission control line ELi. Therefore, the light-emitting element LD may generate light with a luminance corresponding to the data signal.

Figure 3:
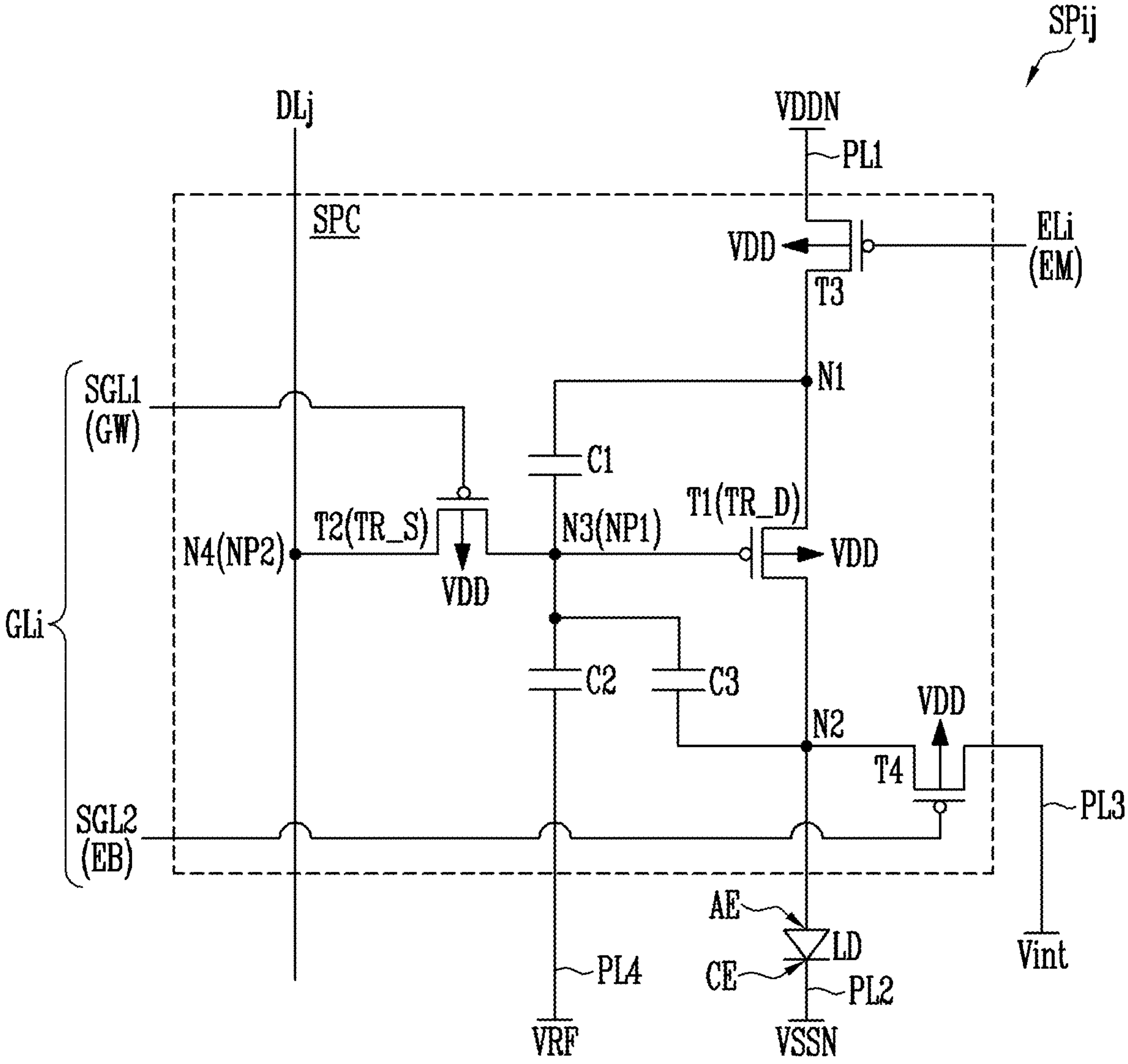
FIG. 3 is a schematic diagram illustrating a sub-pixel circuit and a sub-pixel including the sub-pixel circuit in accordance with one or more embodiments.

FIG. 3 is a schematic diagram illustrating a sub-pixel circuit SPC and a sub-pixel SPij including the sub-pixel circuit SPC in accordance with one or more embodiments. For the sake of convenience in explanation, FIG. 3 illustrates the sub-pixel SPij positioned on a i-th horizontal line and a j-th vertical line among the sub-pixels SP in a manner similar to that of FIG. 2.

Referring to FIG. 3, the sub-pixel circuit SPC may include a first transistor T1, a second transistor T2, a third transistor T3, a fourth transistor T4, a first capacitor C1, a second capacitor C2, and a third capacitor C3.

The light-emitting element LD may include an anode electrode AE and a cathode electrode CE. The anode electrode AE may be electrically connected to the sub-pixel circuit SPC through a second node N2, and may be electrically connected to a first power line PL1 provided to supply a first power voltage VDD. The cathode electrode CE may be electrically connected to a second power line PL2 provided to supply a second power voltage VSS.

The first to fourth transistors T1 to T4 may be transistors each including a body electrode. For example, each of the first to fourth transistors T1 to T4 may be formed of a metal oxide semiconductor field effect transistor (MOSFET). In this case, the first to fourth transistors T1 to T4 may be mounted in a relatively small area, thus allowing the sub-pixel SPij to be applied to a high-resolution panel. The body electrode of each of the first to fourth transistors T1 to T4 may be supplied with the first power voltage VDD. For example, the body electrodes of the first to fourth transistors T1 to T4 may be electrically connected to the first power line PL1 to which the first power voltage VDD is supplied.

In one or more embodiments, each of the first to fourth transistors T1 to T4 may be formed of a P-type transistor. However, the aforementioned example is illustrative, and at least one of the first to fourth transistors T1 to T4 may be substituted with an N-type transistor.

The first transistor T1 may include a first electrode connected to a first node N1, and a second electrode connected to the second node N2. In this specification, the term "connected" implies being electrically linked or joined. A gate electrode of the first transistor T1 may be connected to a third node N3. The first node N1 may refer to a node to which a second electrode of the third transistor T3 is connected. The second node N2 may refer to a node to which the first electrode (i.e., anode electrode AE) of the light-emitting element LD is connected. The first transistor T1 may control, in response to the voltage of the third node N3, the amount of current to be supplied from the first power line PL1 for the supply of the first power voltage VDD to the second power line PL2 for the supply of the second power voltage VSS via the light-emitting element LD. The first transistor T1 may be a driving transistor TR_D.

The second transistor T2 may be connected between the j-th data line DLj and the third node N3. For example, a first electrode of the second transistor T2 may be connected (e.g., electrically connected) to the third node N3, and a second electrode of the second transistor T2 may be connected (e.g., electrically connected) to a fourth node N4. A gate electrode of the second transistor T2 may be electrically connected to the first sub-gate line SGL1. When a first gate signal GW is supplied to the first sub-gate line SGL1, the second transistor T2 may be turned on to electrically connect the j-th data line DLj to the third node N3. In one or more embodiments, the j-th data line DLj may be electrically connected to the second transistor T2 through the fourth node N4. The second transistor T2 may be a switching transistor TR_S.

In one or more embodiments, the third node N3 may be referred to as a first node portion NP1. The fourth node N4 may be referred to as a second node portion NP2.

A first electrode of the third transistor T3 may be electrically connected to the first power line PL1, and a second electrode thereof may be connected to the first node N1. A gate electrode of the third transistor T3 may be electrically connected to the emission control line ELi. The third transistor T3 may be turned on when an emission control signal EM is supplied to the emission control line ELi, and may be turned off when the emission control signal EM is not supplied thereto. If the third transistor T3 is turned off, the first power line PL1 and the first node N1 may be electrically disconnected.

A first electrode of the fourth transistor T4 may be connected to the second node N2, and a second electrode thereof may be electrically connected to a third power line PL3 to which initialization power Vint (e.g., an initialization voltage) is supplied. A gate electrode of the fourth transistor T4 may be electrically connected to the second sub-gate line SGL2. When a second gate signal EB is supplied to the second sub-gate line SGL2, the fourth transistor T4 may be turned on to electrically connect the second node N2 with the third power line PL3.

The first capacitor C1 may be connected between the first node N1 and the third node N3. The first capacitor C1 may be driven as a coupling capacitor, thus transmitting variance in voltage of the first node N1 to the third node N3. Furthermore, the first capacitor C1 may store the voltage of the third node N3.

The second capacitor C2 may be connected between the third node N3 and the fourth power line PL4 to which reference power VRF (e.g., a reference voltage) is supplied. A voltage level of the reference power VRF may be set within a range that does not exceed a maximum voltage of the second capacitor C2. In embodiments, the voltage level of the reference power VRF may be lower than that of the first power voltage VDD and higher than that of the initialization power Vint.

In other embodiments, the voltage level of the reference power VRF may be the same as that of the first power voltage VDD. In this case, the second capacitor C2 may be connected between the third node N3 and the first power line PL1 to which the first power voltage VDD is supplied.

The third capacitor C3 may be connected between the second node N2 and the third node N3. The third capacitor C3 may be driven as a coupling capacitor, thus transmitting variance in voltage of the second node N2 to the third node N3.

In embodiments, each of the first to third capacitors C1 to C3 may have a structure of either a metal-oxide-metal (MOM) capacitor or a metal-insulator-metal (MIM) capacitor. Alternatively, at least one of the first to third capacitors C1 to C3 may have a vertical native capacitor (VNCAP) structure. However, the present disclosure is not limited.

Figure 4:
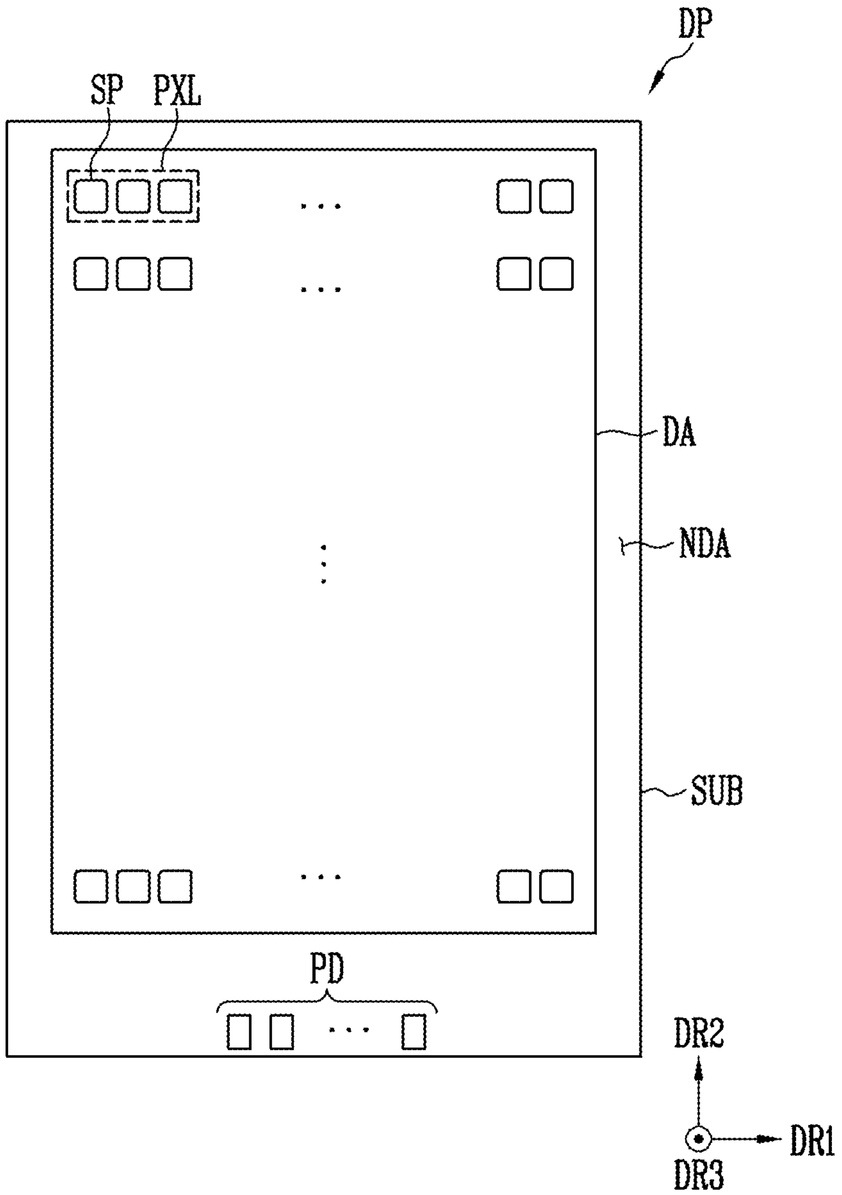
FIG. 4 is a plan view illustrating one or more embodiments of the display panel of FIG. 1.

FIG. 4 is a plan view illustrating one or more embodiments of the display panel 110 of FIG. 1.

Referring to FIG. 4, the display panel DP corresponds to the display panel 110 shown in FIG. 1, and the display panel DP according to one or more embodiments may include a display area DA and a non-display area NDA. The display panel DP may display an image through the display area DA. The non-display area NDA may be located around the display area DA.

The display panel DP may include a substrate SUB, sub-pixels SP, and pads PD.

In the case where the display panel DP is used as a display screen for a head-mounted display (HMD), a virtual reality (VR) device, a mixed reality (MR) device, an augmented reality (AR) device, and the like, the display panel DP may be positioned extremely close to the eyes of the user. In this case, relatively high-density sub-pixels SP may be required. To increase the pixel density of the sub-pixels SP, the substrate SUB may be provided using a silicon substrate. The sub-pixels SP and/or the display panel DP may be formed on the substrate SUB that is a silicon substrate. The display device 100 including the display panel DP having the substrate SUB that is a silicon substrate may be referred to as an OLED on Silicon (OLEDoS) display device.

The sub-pixels SP may be located in the display area DA on the substrate SUB. The sub-pixels SP may be arranged in the form of a matrix along a first direction DR1 and a second direction DR2 crossing with the first direction DR1. However, the embodiments are not limited to the aforementioned example. For example, the sub-pixels SP may be arranged in a zigzag pattern in the first direction DR1 and the second direction DR2. For example, the sub-pixels SP may be arranged in a PENTILE™ form (PENTILE™ being a registered trademark of Samsung Display Co., Ltd., Republic of Korea). The first direction DR1 may refer to a row direction, and the second direction DR2 may refer to a column direction.

Two or more sub-pixels among the sub-pixels SP may form a pixel PXL.

Components for controlling the sub-pixels SP may be located in the non-display area NDA on the substrate SUB. For example, connected to the sub-pixels SP, lines such as the first to m-th gate lines GL1 to GLm and the first to n-th data lines DL1 to DLn of FIG. 1 may be located in the non-display area NDA.

At least one of the gate driver 120, the data driver 130, the voltage generator 140, the controller 150, and the temperature sensor 160 of FIG. 1 may be integrated in the non-display area NDA of the display panel DP. In embodiments, the gate driver 120 of FIG. 1 may be mounted on the display panel DP and positioned in the non-display area NDA. In other embodiments, the gate driver 120 may be implemented as an integrated circuit separate from the display panel DP. In embodiments, the temperature sensor 160 may be positioned in the non-display area NDA to sense the temperature of the display panel DP.

The pads PD may be located in the non-display area NDA on the substrate SUB. The pads PD may be electrically connected to the sub-pixels SP through the lines. For example, the pads PD may be connected to the sub-pixels SP through the first to n-th data lines DL1 to DLn.

The pads PD may interface the display panel DP with other components of the display device 100. In embodiments, voltages and signals required for the operation of the components included in the display panel DP may be provided through the pads PD from the driver integrated circuit DIC of FIG. 1. For example, the first to n-th data lines DL1 to DLn may be connected to the driver integrated circuit DIC through the pads PD. For example, the first and second power voltages VDD and VSS may be received from the driver integrated circuit DIC through the pads PD. For example, in the case where the gate driver 120 is mounted on the display panel DP, the gate control signal GCS may be transmitted from the driver integrated circuit DIC to the gate driver 120 through the pads PD.

In embodiments, a circuit board may be electrically connected to the pads PD by a conductive adhesive component such as an anisotropic conductive film. Here, the circuit board may be a flexible circuit board or flexible film that is made of flexible material. The driver integrated circuit DIC may be mounted on the circuit board, and may be electrically connected to the pads PD.

In embodiments, the display area DA may have various shapes. The display area DA may have a closed-loop shape, including linear and/or curved sides. For example, the display area DA may have shapes such as a polygon, a circle, a semicircle, and an ellipse.

In embodiments, the display panel DP may have a planar display surface. In other embodiments, the display panel DP may have a display surface that is at least partially rounded. In embodiments, the display panel DP may be bendable, foldable, or rollable. In the aforementioned cases, the display panel DP and/or the substrate SUB may include materials having flexible properties.

Figure 5:
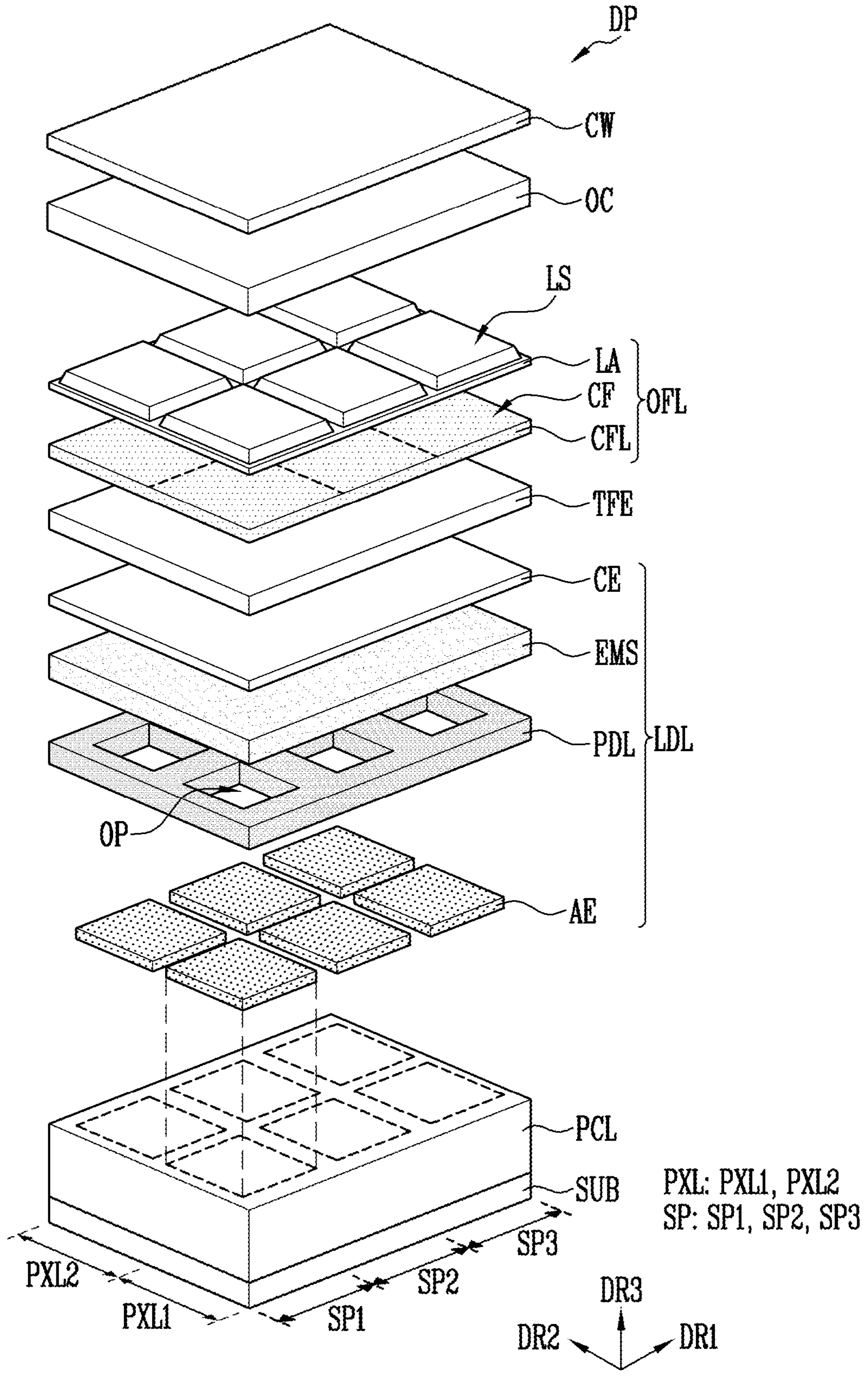
FIG. 5 is an exploded perspective view illustrating a portion of the display panel of FIG. 4.

FIG. 5 is an exploded perspective view illustrating a portion of the display panel DP of FIG. 4. In FIG. 5, for the sake of clear and concise explanation, there is schematically illustrated a portion of the display panel DP corresponding to two pixels PXL1 and PXL2 among the pixels PXL of FIG. 4. The remaining portions of the display panel DP corresponding to the other pixels may also be configured in the same manner.

Referring to FIGS. 4 and 5, the pixel PXL may include first and second pixels PXL1 and PXL2. The sub-pixels SP may include first to third sub-pixels SP1 to SP3. Each of the first and second pixels PXL1 and PXL2 may include first to third sub-pixels SP1, SP2, and SP3. However, the embodiments are not limited to the aforementioned example. For example, each of the first and second pixels PXL1 and PXL2 may include four sub-pixels, or may include two sub-pixels.

In FIG. 5 there is illustrated the case where the first to third sub-pixels SP1, SP2, and SP3 have rectangular shapes and the same size when viewed in a third direction DR3 crossing with the first and second directions DR1 and DR2. However, the embodiments are not limited to the aforementioned example. The first to third sub-pixels SP1, SP2, and SP3 may be modified to have various shapes.

The display panel DP may include a substrate SUB, a pixel-circuit layer PCL, a light-emitting-element layer LDL, an encapsulation layer TFE, an optical function layer OFL, an overcoat layer OC, and a cover window CW.

In embodiments, the substrate SUB may include a silicon wafer substrate formed through a semiconductor process. The substrate SUB may include semiconductor material suitable for forming circuit elements. For example, the semiconductor material may include silicon, germanium, and/or silicon-germanium. The substrate SUB may be provided from a bulk wafer, an epitaxial layer, a silicon on insulator (SOI) layer, a semiconductor on insulator (SeOI) layer, or the like. In embodiments, the substrate SUB may include a glass substrate. In embodiments, the substrate SUB may include a polyimide (PI) substrate.

The pixel-circuit layer PCL may be located on the substrate SUB. The substrate SUB and/or the pixel-circuit layer PCL may include insulating layers, and conductive patterns located between the insulating layers. The conductive patterns of the pixel-circuit layer PCL may function as at least some of the circuit components, lines, and the like. The conductive patterns may include copper, but embodiments are not limited thereto.

The circuit elements may include respective sub-pixel circuits SPC of the first to third sub-pixels SP1, SP2, and SP3. The sub-pixel circuit SPC may include transistors and one or more capacitors. Each transistor may include a semiconductor portion including a source area, a drain area, and a channel area, and a gate electrode overlapping the semiconductor portion. In embodiments, in the case where the substrate SUB is formed of a silicon substrate, the semiconductor portion may be included in the substrate SUB, and the gate electrode may be included in the pixel-circuit layer PCL as a conductive pattern of the pixel-circuit layer PCL. In one or more embodiments, in the case where the substrate SUB is formed of a glass substrate or a PI substrate, the semiconductor portion and the gate electrode may be included in the pixel-circuit layer PCL. Each capacitor may include electrodes spaced apart from each other. For example, each capacitor may include electrodes spaced apart from each other on a plane defined in the first and second directions DR1 and DR2. For example, each capacitor may include electrodes spaced apart from each other in the third direction DR3 with an insulating layer interposed therebetween.

The lines of the pixel-circuit layer PCL may include signal lines connected to each of the first to third sub-pixels SP1, SP2, and SP3, for example, a gate line, an emission control line, and a data line. The lines may further include a line connected to the first power voltage node VDDN of FIG. 2. Furthermore, the lines may further include a line connected to the second power voltage node VSSN of FIG. 2.

The light-emitting-element layer LDL may include anode electrodes AE, a pixel-defining layer PDL, an emission structure EMS, and a cathode electrode CE.

The anode electrodes AE may be located on the pixel-circuit layer PCL. The anode electrodes AE may contact circuit elements of the pixel-circuit layer PCL. The anode electrodes AE may include opaque conductive material capable of reflecting light, but embodiments are not limited thereto.

The pixel-defining layer PDL may be located on the anode electrodes AE. The pixel-defining layer PDL may include openings OP that expose respective portions of the anode electrodes AE. Respective emission areas corresponding to the first to third sub-pixels SP1 to SP3 may be defined by the openings OP in the pixel-defining layer PDL. Alternatively, the respective emission areas corresponding to the first to third sub-pixels SP1 to SP3 may be understood as being defined by the anode electrodes AE. In an area adjacent to a boundary of neighboring sub-pixels SP, the pixel-defining layer PDL may include a separator that causes a discontinuity to be formed in the emission structure EMS. In this case, the respective emission areas corresponding to the first to third sub-pixels SP1 to SP3 may be understood as being defined by the separators of the pixel-defining layer PDL.

In embodiments, the pixel-defining layer PDL may include inorganic material. In this case, the pixel-defining layer PDL may include a plurality of inorganic layers stacked on top of one another. For example, the pixel-defining layer PDL may include silicon oxide ($SiO_x$) and silicon nitride ($SiN_x$). In one or more embodiments, the pixel-defining layer PDL may include organic material. However, the material of the pixel-defining layer PDL is not limited to the aforementioned examples.

The emission structure EMS may be located on the anode electrodes AE exposed through the openings OP in the pixel-defining layer PDL. The emission structure EMS may include an emission layer configured to generate light, an electron transport layer configured to transport electrons, and a hole transport layer configured to transport holes.

In embodiments, the emission structure EMS may fill the openings OP in the pixel-defining layer PDL, and may be located on an overall surface of an upper portion of the pixel-defining layer PDL. In other words, the emission structure EMS may extend over the first to third sub-pixels SP1 to SP3. In this case, at least some of the layers in the emission structure EMS may be interrupted or bent on boundaries between the first to third sub-pixels SP1 to SP3. However, the embodiments are not limited to the aforementioned example. For instance, portions of the emission structure EMS corresponding to the first to third sub-pixels SP1 to SP3 may be separated from each other, and each may be located in the corresponding opening OP in the pixel-defining layer PDL.

The cathode electrode CE may be located on the emission structure EMS. The cathode electrode CE may extend over the first to third sub-pixels SP1 to SP3. As such, the cathode electrode CE may be provided as a common electrode for the first to third sub-pixels SP1 to SP3.

The cathode electrode CE may be a thin-film metal layer having a thickness allowing light emitted from the emission structure EMS to pass therethrough. The cathode electrode CE may be made of a metal material having a relatively small thickness, or a transparent conductive material. In embodiments, the cathode electrode CE may include at least one of various transparent conductive materials including indium tin oxide, indium zinc oxide, indium tin zinc oxide, aluminum zinc oxide, gallium zinc oxide, zinc tin oxide, or gallium tin oxide. In embodiments, the cathode electrode CE may include at least one of silver (Ag), magnesium (Mg), and/or a compound thereof. However, the material of the cathode electrode CE is not limited to the foregoing example.

Any one of the anode electrodes AE, a portion of the emission structure EMS that overlap the any one of the anode electrodes AE, and a portion of the cathode electrode CE that overlaps the portion of the emission structure EMS can be understood as constituting one light-emitting element LD. In other words, each of the light-emitting elements LD of the first to third sub-pixels SP1 to SP3 may include an anode electrode AE, a portion of the emission structure EMS that overlaps the anode electrode AE, and a portion of the cathode electrode CE that overlaps the portion of the emission structure EMS. In each of the first to third sub-pixels SP1 to SP3, holes injected from the anode electrode AE and electrons injected from the cathode electrode CE are transported into the emission layer of the emission structure EMS, thus forming excitons. When the excitons make a transition from an excited state to a ground state, light can be generated. Depending on the amount of current flowing through the emission layer, the luminance of light may be determined. Depending on the configuration of the emission layer, the wavelength range of light to be generated may be determined.

In one or more embodiments, each light-emitting element LD may be an organic light-emitting diode.

The encapsulation layer TFE may be located on the cathode electrode CE. The encapsulation layer TFE may cover the light-emitting-element layer LDL and/or the pixel-circuit layer PCL. The encapsulation layer TFE may be configured to reduce or prevent permeation of oxygen and/or water or the like into the light-emitting-element layer LDL. In embodiments, the encapsulation layer TFE may include a structure formed by alternately stacking one or more inorganic layers and one or more organic layers. For example, the inorganic layer may include silicon nitride, silicon oxide, silicon oxynitride ($SiO_xN_y$), or the like. For example, the organic layer may include organic insulating material such as acrylic resin, epoxy resin, phenol resin, polyamide resin, polyimide resin, unsaturated polyester resin, polyphenylenether resin, polyphenylenesulfide resin, or benzocyclobutene (BCB). However, the materials of the organic layer and the inorganic layer of the encapsulation layer TFE are not limited to the aforementioned examples.

The encapsulation layer TFE may further include a thin film, including aluminum oxide ($AlO_x$), to enhance the encapsulation efficiency of the encapsulation layer TFE. The thin film including aluminum oxide may be positioned on an upper surface of the encapsulation layer TFE that faces the optical functional layer OFL and/or under a lower surface of the encapsulation layer TFE that faces the light-emitting-element layer LDL.

The thin film including aluminum oxide may be formed through an atomic layer deposition (ALD) method. However, the embodiments are not limited to the aforementioned example. The encapsulation layer TFE may further include a thin film formed of at least one of various materials suitable for enhancing the encapsulation efficiency.

The optical functional layer OFL may be located on the encapsulation layer TFE. The optical functional layer OFL may include a color filter layer CFL and a lens array LA.

The color filter layer CFL may be located between the encapsulation layer TFE and the lens array LA. The color filter layer CFL may be configured to filter light emitted from the emission structure EMS and selectively output light in a wavelength range or color corresponding to each sub-pixel SP. The color filter layer CFL may include color filters CF respectively corresponding to the first to third sub-pixels SP1 to SP3. Each of the color filters CF allows light within a wavelength range corresponding to the related sub-pixel SP to pass therethrough. For example, the color filter CF that corresponds to the first sub-pixel SP1 allows light in a red color to pass therethrough, the color filter CF that corresponds to the second sub-pixel SP2 allows light in a green color to pass therethrough, and the color filter CF that corresponds to the third sub-pixel SP3 allows light in a blue color to pass therethrough. Depending on the light emitted from the emission structure EMS of each sub-pixel SP, at least some of the color filters CF may be omitted.

The lens array LA may be located on the color filter layer CFL. The lens array LA may include lenses LS that respectively correspond to the first to third sub-pixels SP1 to SP3. Each of the lenses LS may output and direct light emitted from the emission structure EMS along an intended path, thus enhancing the light output efficiency. The lens array LA may have a relatively high refractive index. For example, the lens array LA may have a higher refractive index than the overcoat layer OC. In embodiments, the lenses LS may include organic material. In embodiments, the lenses LS may include acrylic material. However, the material of the lenses LS is not limited to the foregoing example.

In embodiments, compared to the opening OP of the pixel-defining layer PDL, at least some of the color filters CF of the color filter layer CFL and at least some of the lenses LS of the lens array LA may be shifted in a direction parallel to the plane defined in the first and second directions DR1 and DR2. For example, in a central area of the display area DA, the center of each color filter CF and the center of each lens LS may be aligned or overlapped with the center of the corresponding opening OP of the pixel-defining layer PDL. For example, in the central area of the display area DA, the opening OP of the pixel-defining layer PDL may completely overlap the corresponding color filter CF of the color filter layer CFL and the corresponding lens LS of the lens array LA. In an area adjacent to the non-display area NDA within the display area DA, the center of the color filter CF and the center of the lens LS may be shifted in a plane direction from the center of the corresponding opening OP of the pixel-defining layer PDL when viewed in the third direction DR3. For example, in the area adjacent to the non-display area NDA within the display area DA, each opening OP of the pixel-defining layer PDL may partially overlap the corresponding color filter CF of the color filter layer CFL and the corresponding lens LS of the lens array LA. Accordingly, light emitted from the emission structure EMS in the central portion of the display area DA may be efficiently outputted in the normal direction of the display surface. Light emitted from the emission structure EMS around the perimeter of the display area DA may be efficiently outputted in a direction inclined at a certain angle with respect to the normal direction of the display surface.

The overcoat layer OC may be located on the lens array LA. The overcoat layer OC may cover the optical function layer OFL, the encapsulation layer TFE, the emission structure EMS, and/or the pixel-circuit layer PCL. The overcoat layer OC may include various materials suitable for protecting underlying layers from foreign substances such as dust, water, or the like. For example, the overcoat layer OC may include at least one of an inorganic insulating layer and/or an organic insulating layer. For instance, the overcoat layer OC may include epoxy, but the embodiments are not limited thereto. The overcoat layer OC may have a lower refractive index than the lens array LA.

The cover window CW may be located on the overcoat layer OC. The cover window CW may be configured to protect underlying layers. The cover window CW may have a higher refractive index than the overcoat layer OC. The cover window CW may include glass, but embodiments are not limited thereto. For example, the cover window CW may be an encapsulation glass layer configured to protect components located thereunder. In other embodiments, the cover window CW may be omitted.

Figure 6:
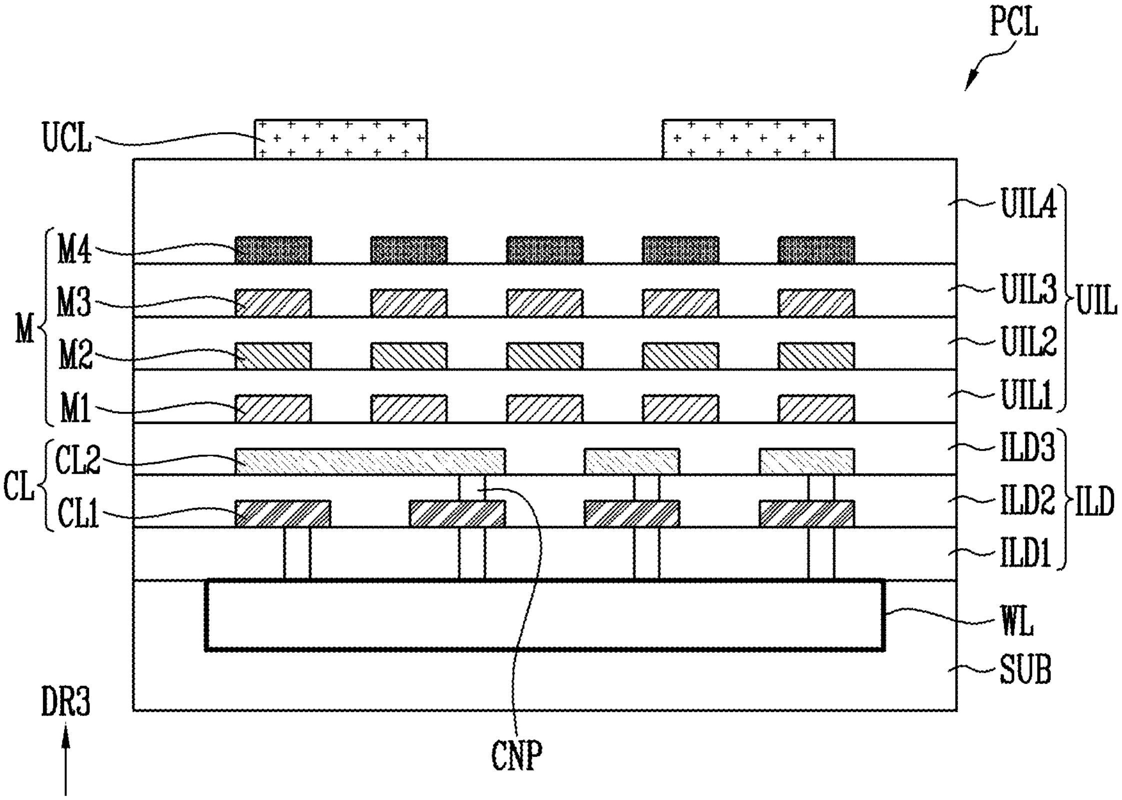
FIG. 6 is a schematic sectional view illustrating a pixel-circuit layer in accordance with one or more embodiments.

Referring to FIG. 6, a cross-sectional structure of the pixel-circuit layer PCL in which circuit elements of the sub-pixel circuit SPC and the lines electrically connected to the sub-pixel circuit SPC according to one or more embodiments can be formed will be described.

FIG. 6 is a schematic sectional view illustrating the pixel-circuit layer PCL in accordance with one or more embodiments.

In accordance with one or more embodiments, the pixel-circuit layer PCL may include a substrate SUB, and may also include conductive layers CL, conductive structure layers M, interlayer insulating layers ILD (e.g., interlayer dielectrics), upper insulating layers UIL, and an upper conductive layer UCL.

In one or more embodiments, the circuit elements of the sub-pixel circuit SPC may be patterned on the substrate SUB.

For example, the substrate SUB may be a silicon substrate, and a well WL formed through an ion implantation process may be located in the substrate SUB. A portion of the well WL may form a first transistor electrode area TRA1 (e.g., see FIG. 9) of each of the transistors T1 to T4. Another portion of the well WL may form a second transistor electrode area TRA2 (e.g., see FIG. 9) of each of the transistors T1 to T4. Another portion of the well WL may form a channel area of each of the transistors T1 to T4.

In one or more embodiments, the first transistor electrode area TRA1 may be a source electrode, and the second transistor electrode area TRA2 may be a drain electrode. Alternatively, in one or more embodiments, the first transistor electrode area TRA1 may be a drain electrode, and the second transistor electrode area TRA2 may be a source electrode.

In one or more embodiments, the conductive layers CL may form electrodes electrically connected to the first and second transistor electrode areas TRA1 and TRA2 of the transistors T1 to T4, and may form the gate electrodes of the transistors T1 to T4. For example, at least some of the conductive layers CL may be electrically connected to the well WL through contact members CNP. Furthermore, at least some of the conductive layers CL may form at least some of the first to fourth nodes N1 to N4 described above. Furthermore, at least some of the conductive structure layers M may form at least some of the first to fourth nodes N1 to N4 described above. Consequently, the substrate SUB, and the conductive layers CL and the conductive structure layers M on the substrate SUB may form the sub-pixel circuit SPC.

In one or more embodiments, the conductive layers CL may form at least some of the lines electrically connected to the sub-pixel circuit SPC. For example, the conductive layers CL may form at least respective portions of the first and second sub-gate lines SGL1 and SGL2, the emission control line EL, the first power line PL1, the third power line PL3, and the fourth power line PL4.

In one or more embodiments, the well WL, the conductive layers CL, and some of the conductive structure layers M may be electrically connected to each other through contact members CNP passing through the interlayer insulating layers ILD or at least one of the upper insulating layers UIL. In one or more embodiments, the upper conductive layer UCL may be electrically connected to the conductive layer CL and at least some of the conductive structure layers M, thereby electrically connecting the sub-pixel circuit SPC with the anode electrode AE of the light-emitting element LD.

In one or more embodiments, the conductive layers CL may include first and second conductive layers CL1 and CL2. In one or more embodiments, the interlayer insulating layers ILD may include first to third interlayer insulating layers ILD1 to ILD3. In one or more embodiments, the conductive structure layers M may include first to fourth conductive structure layers M1 to M4. In one or more embodiments, the upper insulating layers UIL may include first to fourth upper insulating layers UIL1 to UIL4. However, the present disclosure is not limited to the aforementioned example. The number of layers that form each of the conductive layers CL, the conductive structure layers M, the inter layer dielectric ILD, and the upper insulating layer UIL may be changed.

In one or more embodiments, each of the first to third interlayer insulating layers ILD1 to ILD3 and the first to fourth upper insulating layers UIL1 to UIL4 may be located between respective ones of the substrate SUB, the first and second conductive layers CL1 and CL2, the first to fourth conductive structure layers M1 to M4, and the upper conductive layer UCL.

In one or more embodiments, the conductive layers CL and the conductive structure layers M may include various conductive materials. The interlayer insulating layers ILD and the upper insulating layers UIL may include inorganic material. However, the present disclosure is not limited.

In one or more embodiments, the conductive structure layers M may be spaced farther from the substrate SUB than the conductive layers CL. The conductive structure layers M may be spaced apart from the substrate SUB, and may secure a facing surface area between first and second capacitor electrodes forming the capacitors C1 to C3, thereby making it possible to form sufficient capacitance in the sub-pixel circuit SPC. The conductive structure layers M may be adjacent to the conductive layers CL adjacent to the substrate SUB in a thickness direction of the substrate SUB (e.g., in the third direction DR3, or a vertical direction), and may form capacitance of the capacitors C1 to C3 at a height different from the conductive layers CL. Accordingly, the capacitance of the sub-pixel circuit SPC in a relatively small area may be relatively increased.

In one or more embodiments, at least some of the conductive structure layers M may form at least some of the lines electrically connected to the sub-pixel circuit SPC. For example, at least one or more of the conductive structure layers M may form the data lines DL.

The conductive layers CL and the conductive structure layers M may form the sub-pixel circuit SPC, and the lines electrically connected to the sub-pixel circuit SPC. For the display device 100 to have high-resolution characteristics, the conductive layers CL and the conductive structure layers M need to be patterned within a relatively small area.

In the case where the conductive layers CL and the conductive structure layers M are patterned in an area, conductive portions configured to receive different signals may be adjacent to each other. In this case, there is a possibility that signals may interfere with each other, thus leading to risks such as crosstalk. However, the display device 100 in accordance with one or more embodiments may include an intermediate member IPM (refer to FIG. 8) and/or a cover layer CVL (refer to FIG. 19), thereby reducing risks such as signal interference.

First, the display device 100 including an intermediate member IPM in accordance with one or more embodiments will be described with reference to FIGS. 7 to 18. For the sake of convenience in explanation, descriptions of content that overlap those of the embodiments described above will be simplified or omitted.

FIGS. 7 to 18 are schematic views illustrating the display device 100 including the intermediate member IPM in accordance with one or more embodiments. In the following drawings, the patterning of the layers on the substrate SUB is depicted in the same manner as shown in FIG. 6. Layers depicted with the same patterning may be understood as being patterned through the same process and including the same materials.

Figure 7:
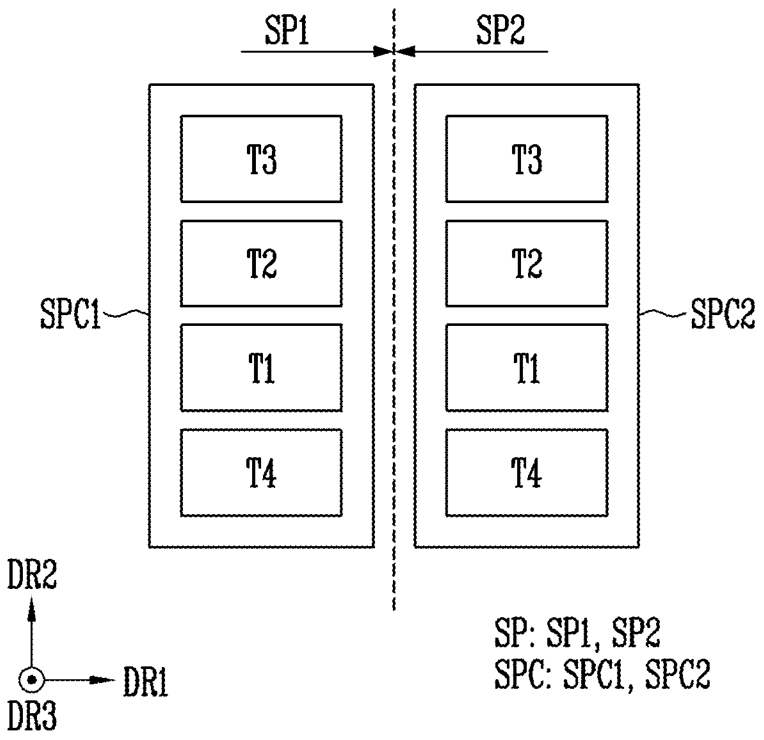
FIGS. 7 to 18 are schematic views illustrating a display device including an intermediate member in accordance with one or more embodiments.
Figure 8:
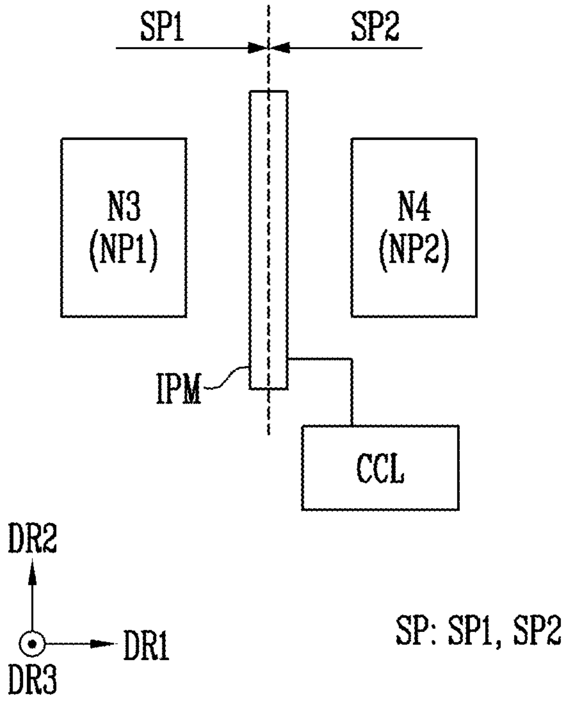

FIGS. 7 and 8 schematically illustrate circuit elements between neighboring sub-pixel circuits SPC and structures adjacent thereto in accordance with one or more embodiments.

Hereinafter, for the sake of convenience in explanation, the description will be based on an area where the first and second sub-pixels SP1 and SP2 among neighboring sub-pixels SP are adjacent to each other.

Referring to FIGS. 7 and 8, the sub-pixel circuit SPC may include a first sub-pixel circuit SPC1 included in the first sub-pixel SP1, and a second sub-pixel circuit SPC2 included in the second sub-pixel SP2.

The first sub-pixel SP1 and the second sub-pixel SP2 may be adjacent to each other. Accordingly, the first sub-pixel circuit SPC1 and the second sub-pixel circuit SPC2 may be adjacent to each other.

For example, the first sub-pixel SP1 and the second sub-pixel SP2 may be adjacent to each other in the first direction DR1. The first sub-pixel circuit SPC1 and the second sub-pixel circuit SPC2 may also be adjacent to each other in the first direction DR1.

The circuit elements of each of the sub-pixel circuits SPC may be arranged in a second direction DR2 different from the first direction DR1. For example, in each of the first and second sub-pixel circuits SPC1 and SPC2, the fourth transistor T4, the first transistor T1, the second transistor T2, and the third transistor T3 may be arranged (e.g., sequentially arranged) in the second direction DR2.

The circuit elements of the first sub-pixel circuit SPC1 and the corresponding circuit elements of the second sub-pixel circuit SPC2 may face each other. For example, the respective first transistors T1 of the first sub-pixel circuit SPC1 and the second sub-pixel circuit SPC2 may face each other in the first direction DR1. The respective second transistors T2 of the first sub-pixel circuit SPC1 and the second sub-pixel circuit SPC2 may face each other in the first direction DR1. The respective third transistors T3 of the first sub-pixel circuit SPC1 and the second sub-pixel circuit SPC2 may face each other in the first direction DR1. The respective fourth transistors T4 of the first sub-pixel circuit SPC1 and the second sub-pixel circuit SPC2 may face each other in the first direction DR1.

At least one of the nodes of the first sub-pixel SP1 may face at least one of the nodes of the second sub-pixel SP2. For example, the third node N3 (e.g., the first node portion NP1) of the first sub-pixel SP1 may face the fourth node N4 (e.g., the second node portion NP2) of the second sub-pixel SP2.

In one or more embodiments, the display device 100 may include an intermediate member IPM and a conductive connection line CCL.

The intermediate member IPM may be electrically connected to the conductive connection line CCL. The intermediate member IPM may be supplied with an electrical signal (voltage or the like) supplied to the conductive connection line CCL.

In one or more embodiments, the intermediate member IPM may be referred to as an intermediate protective component.

The conductive connection line CCL may be supplied with an electrical signal that is different from an electrical signal supplied to each of the first node portion NP1 and the second node portion NP2. Consequently, electrical information different from electrical information supplied to the first node portion NP1 and the second node portion NP2 may be applied to the intermediate member IPM.

The intermediate member IPM may be located between the first node portion NP1 and the second node portion NP2. The intermediate member IPM may block a space between the first node portion NP1 and the second node portion NP2.

The first node portion NP1 may be a node through which a gate signal is supplied to the driving transistor TR_D. The second node portion NP2 may be a node through which a data signal is supplied to the switching transistor TR_S. Experimentally, in the case where the first node portion NP1 and the second node portion NP2 are excessively adjacent to each other, signals supplied to the respective node portions NP1 and NP2 may interfere with each other, thereby leading to a crosstalk risk causing distortion of a data signal or the like.

In one or more embodiments, because the intermediate member IPM configured to receive an electrical signal that is different from signals supplied to the first and second node portions NP1 and NP2 can be located between the first node portion NP1 and the second node portion NP2, the node portions NP1 and NP2 may be appropriately shielded from each other. In this case, risks such as crosstalk may be reduced, thereby decreasing the likelihood of display quality degradation. As a result, the sub-pixel circuits SPC may be arranged within a relatively small area, thus reducing the size of the sub-pixels SP, thereby making it possible to provide the display device 100 having high-resolution characteristics.

Hereinafter, the display device 100 including the intermediate member IPM will be described in more detail with reference to the layout diagrams of the sub-pixel circuit SPC according to one or more embodiments illustrated in FIGS. 9 to 18. Here, the structure of the sub-pixel circuit SPC is not limited to the following drawings.

In the drawings following FIG. 9, layers identical to the layers previously described with reference to FIG. 6 (e.g., layers patterned through the same process) may be represented with the same hatching.

First, the display device 100 including an intermediate member IPM formed in accordance with a structure will be described with reference to FIGS. 9 to 11.

Figure 9:
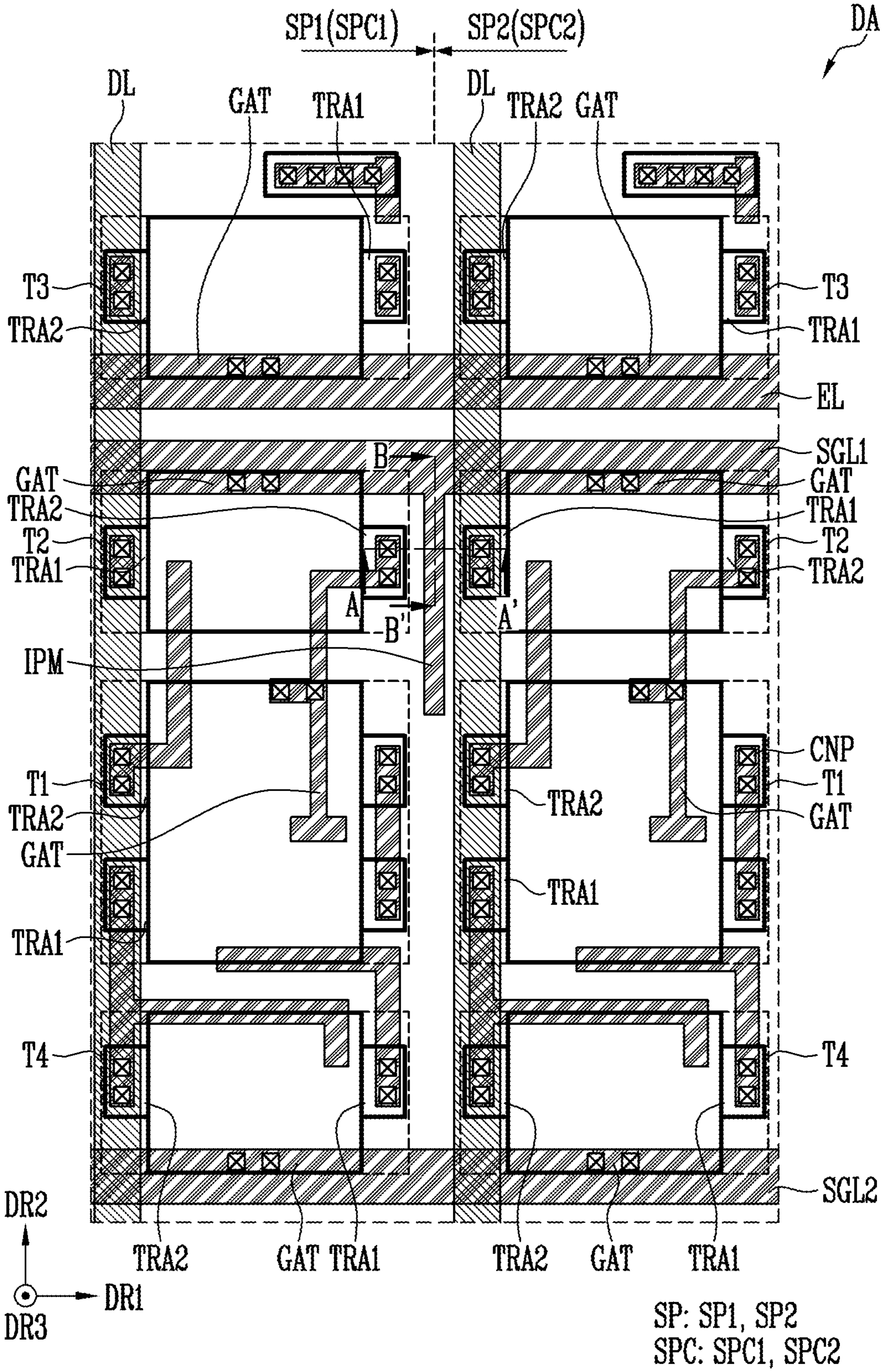
Figure 10:
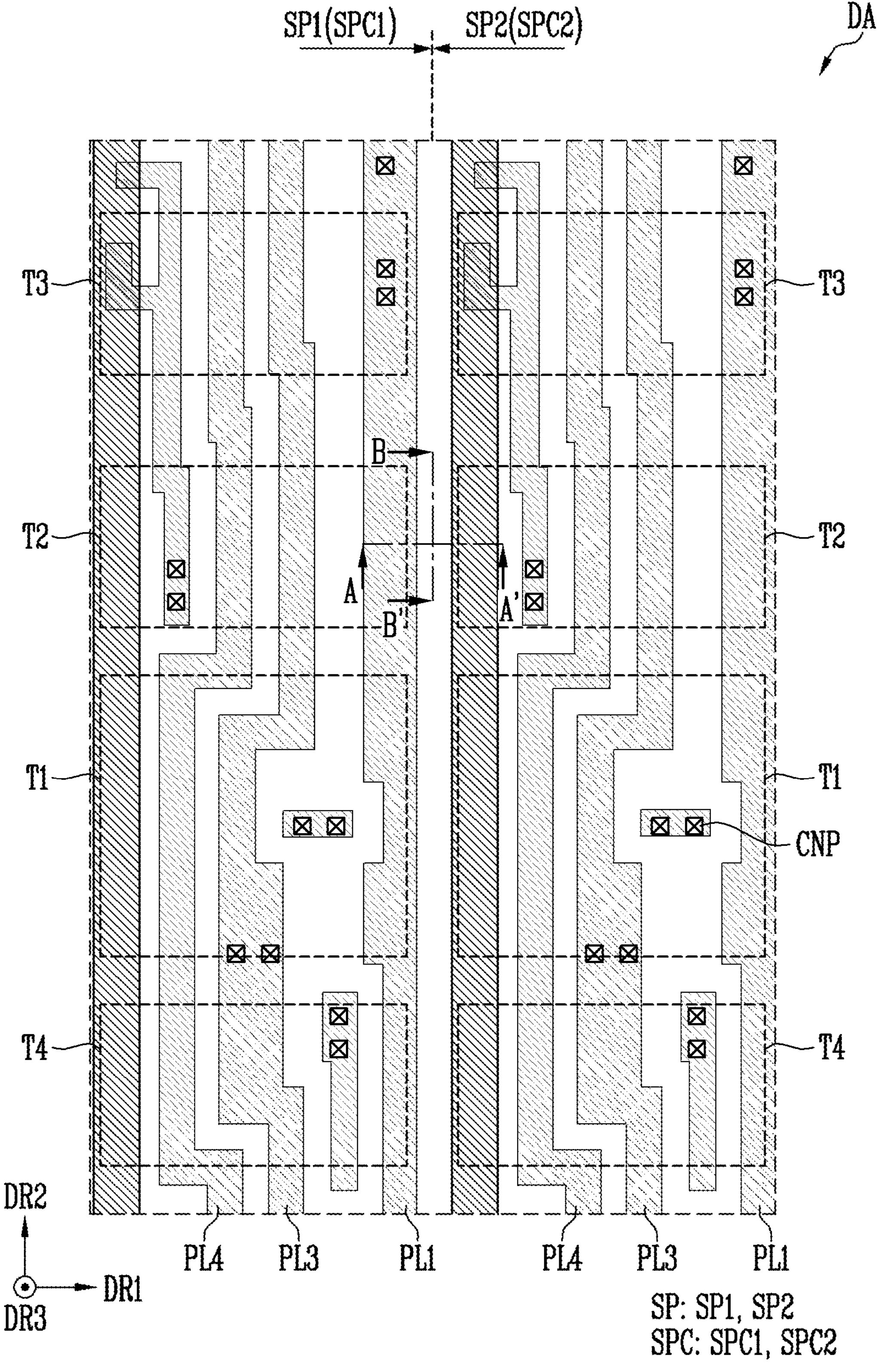
Figure 11:
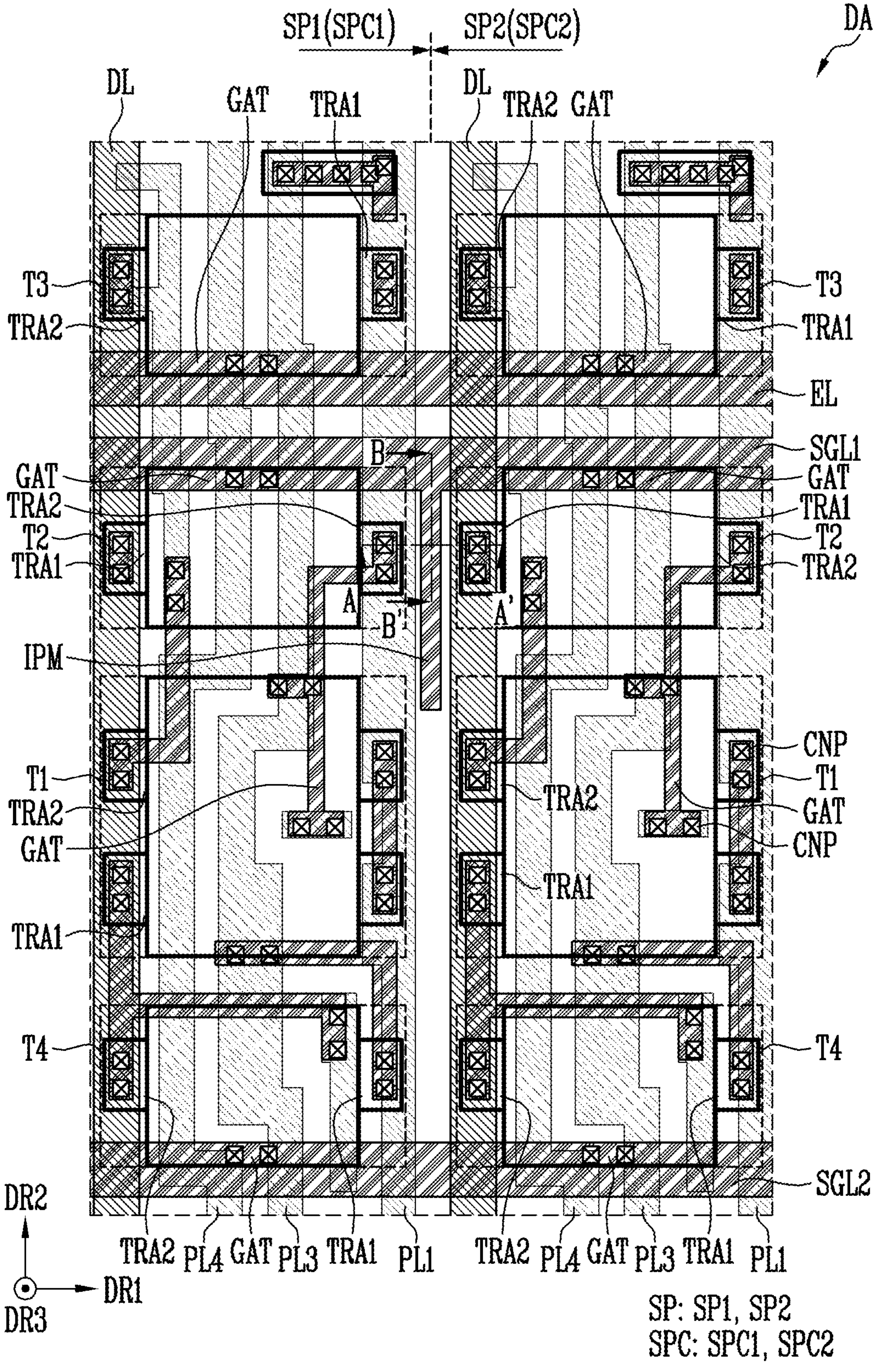

FIGS. 9 to 11 are plan views illustrating the intermediate member IPM, the sub-pixel circuit SPC, and lines electrically connected thereto in accordance with one or more embodiments.

FIG. 9 illustrates the well WL, the first conductive layer CL1, the contact members CNP, and the data lines DL. FIG. 10 illustrates the second conductive layer CL2, the contact members CNP, and the data lines DL. FIG. 11 illustrates all of the well WL, the first and second conductive layers CL1 and CL2, and the data lines DL. FIGS. 9 to 11 depict the same area in the display area DA. A disposition relationship between the components can be more clearly understood with reference to FIGS. 9 to 11.

Figure 12:
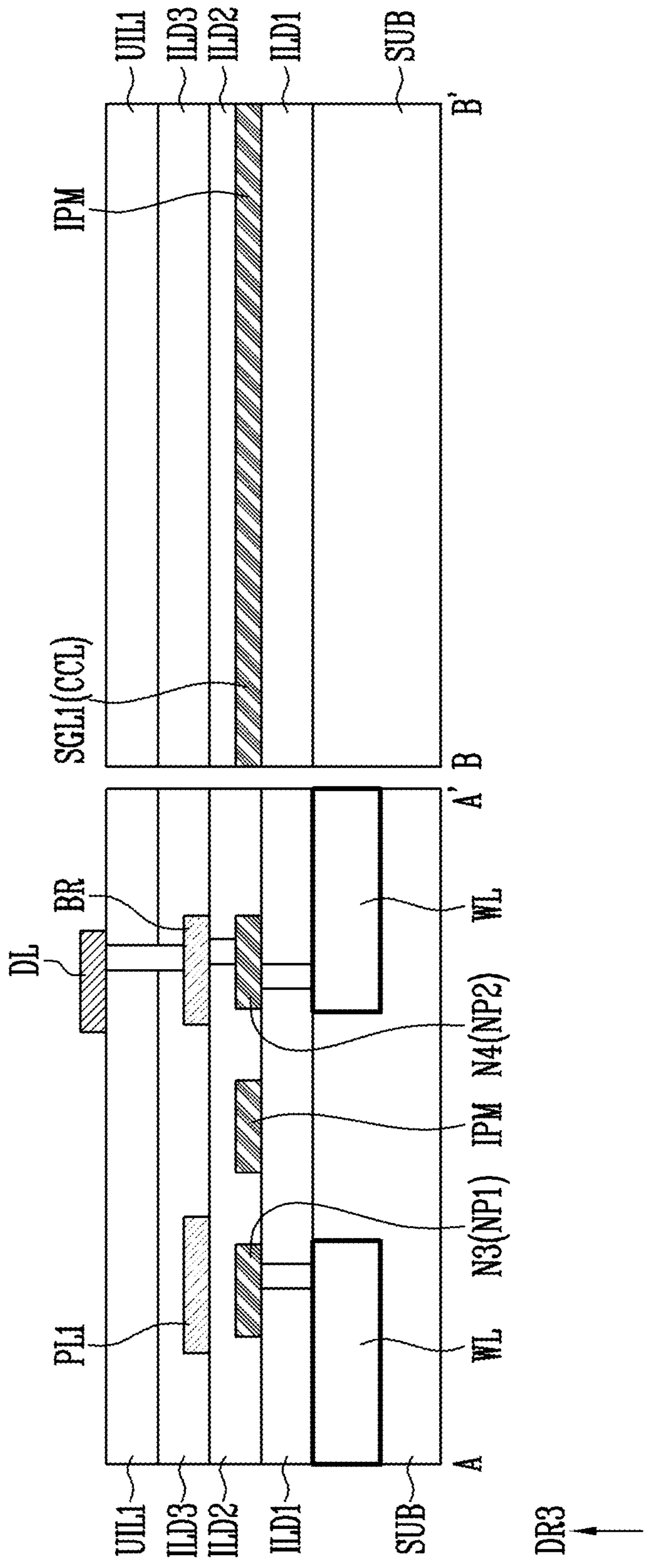

FIG. 12 illustrates a schematic sectional view taken along the line A-A' of FIGS. 9 to 11, and a schematic sectional view taken along the line B-B'.

Referring to FIGS. 9 to 12, in the display area DA, a stacked structure included in the display device 100 in accordance with one or more embodiments may have a shape in which at least a portion of a structure formed by stacking the substrate SUB including the well WL, the conductive layer CL, the conductive structure layers M, the interlayer insulating layers ILD, the upper insulating layer UIL, and the upper conductive layer UCL is patterned. In FIGS. 9 to 12, the well WL is represented by relatively thick lines. In FIGS. 9 to 12, a range within which the first to fourth transistors T1 to T4 are formed is depicted with dotted-line boxes. In FIGS. 9 to 12, each contact member CNP that electrically connect different layers is depicted as a square shape with an X mark.

Referring to FIGS. 9 to 12, the first and second sub-pixel circuits SPC1 and SPC2 may be adjacent to each other in the first direction DR1. In each of the first and second sub-pixel circuits SPC1 and SPC2, the first to fourth transistors T1 to T4 may be arranged in the second direction DR2.

The first to fourth transistors T1 to T4 of each of the first and second sub-pixel circuits SPC1 and SPC2 may each include a first transistor electrode area TRA1, a second transistor electrode area TRA2, and a gate electrode GAT.

The emission control line EL may extend in the first direction DR1. The emission control line EL may be formed by the first conductive layer CL1. The emission control line EL may be located over the first and second sub-pixels SP1 and SP2, and may form the gate electrode GAT of the third transistor T3. In one or more embodiments, the emission control line EL may be located between the second transistor T2 and the third transistor T3.

The first sub-gate line SGL1 may extend in the first direction DR1. The first sub-gate line SGL1 may be formed by the first conductive layer CL1. The first sub-gate line SGL1 may be located over the first and second sub-pixels SP1 and SP2, and may form a gate electrode GAT of the second transistor T2. In one or more embodiments, the first sub-gate line SGL1 may be located between the second transistor T2 and the third transistor T3.

The second sub-gate line SGL2 may extend in the first direction DR1. The second sub-gate line SGL2 may be formed by the first conductive layer CL1. The second sub-gate line SGL2 may be located over the first and second sub-pixels SP1 and SP2, and may form a gate electrode GAT of the fourth transistor T4. In one or more embodiments, the second sub-gate line SGL2 may be located below the fourth transistor T4, in a plan view. In one or more embodiments, the second sub-gate line SGL2 may be located on a side of the fourth transistor T4 in a direction opposite to the second direction DR2. For example, based on the second direction DR2, the first transistor T1 may be located on a side of the fourth transistor T4, and the second sub-gate line SGL2 may be located on the other side of the fourth transistor T4.

The data line DL may extend in the second direction DR2. The data line DL may be formed by one of the conductive structure layers M (e.g., the second conductive structure layer M2). The data line DL may be electrically connected to the second transistor T2 through a contact member CNP.

The data line DL may be formed in each of the sub-pixels SP, and may be adjacent to a side of the first to fourth transistors T1 to T4. For example, the data line DL electrically connected to the second sub-pixel circuit SPC2 of the second sub-pixel SP2 may be adjacent to a side of the first sub-pixel SP1.

The first power line PL1 may extend (e.g., generally) in the second direction DR2. The first power line PL1 may be formed by the second conductive layer CL2. The first power line PL1 may be electrically connected to the third transistor T3 through a contact member CNP.

The third power line PL3 may extend (e.g., generally) in the second direction DR2. The third power line PL3 may be formed by the second conductive layer CL2. The third power line PL3 may be electrically connected to the fourth transistor T4 through a contact member CNP and a portion of the first conductive layer CL1.

The fourth power line PL4 may extend (e.g., generally) in the second direction DR2. The fourth power line PL4 may be formed by the second conductive layer CL2.

In one or more embodiments, at least a portion of each of the first power line PL1, the third power line PL3, and the fourth power line PL4 that extend in the second direction DR2 may have a relatively large width in an area adjacent to the first node portion NP1. In this case, at least a portion of each of the first power line PL1, the third power line PL3, and the fourth power line PL4 may function as a shielding electrode for the first node portion NP1, thereby reducing or preventing interference between electrical signals.

The intermediate member IPM may be electrically connected to the first sub-gate line SGL1 that is the conductive connection line CCL. For example, the intermediate member IPM may be formed by the first conductive layer CL1, and may be integrally formed with the conductive connection line CCL that functions as the first sub-gate line SGL1. For example, the intermediate member IPM may extend in the second direction DR2 from a portion of the conductive connection line CCL that extends in the first direction DR1. The intermediate member IPM may be located between the first node portion NP1 and the second node portion NP2 in the same layer. The intermediate member IPM may be formed by the first conductive layer CL1.

The first node portion NP1 may be formed by one or more conductive layers. At least a portion of the first node portion NP1 may be formed by the first conductive layer CL1.

The second node portion NP2 may be formed by one or more conductive layers. At least a portion of the second node portion NP2 may be formed by the first conductive layer CL1. For example, the second node portion NP2 may be electrically connected to the data line DL through a bridge layer BR formed by the second conductive layer CL2.

Accordingly, the first conductive layer CL1 may form at least a portion of each of the first node portion NP1 and the second node portion NP2, and may form the intermediate member IPM.

Experimentally, electrical interference and the resulting crosstalk between different nodes may occur more significantly when adjacent nodes are placed in the same layer.

In one or more embodiments, to enhance the integration density of the sub-pixel circuit SPC, at least respective portions of the first and second node portions NP1 and NP2 may be located in the same layer and positioned adjacent to each other. In this case as well, according to one or more embodiments, between the at least respective portions of the first and second node portions NP1 and NP2 that are located in the same layer, the intermediate member IPM located in the same layer may be interposed. Accordingly, electrical interference between different nodes may be reduced or prevented, and risks such as crosstalk may be reduced. Eventually, the sub-pixel circuit SPC may be formed in a relatively small area, thereby making it possible to provide the display device 100 having high-resolution characteristics.

The display device 100 including an intermediate member IPM formed in accordance with a structure will be described with reference to FIGS. 13 to 15. For the sake of convenience in explanation, descriptions that may overlap the aforementioned content, such as the embodiments described above with reference to FIGS. 9 to 12, will be simplified or omitted.

Figure 13:
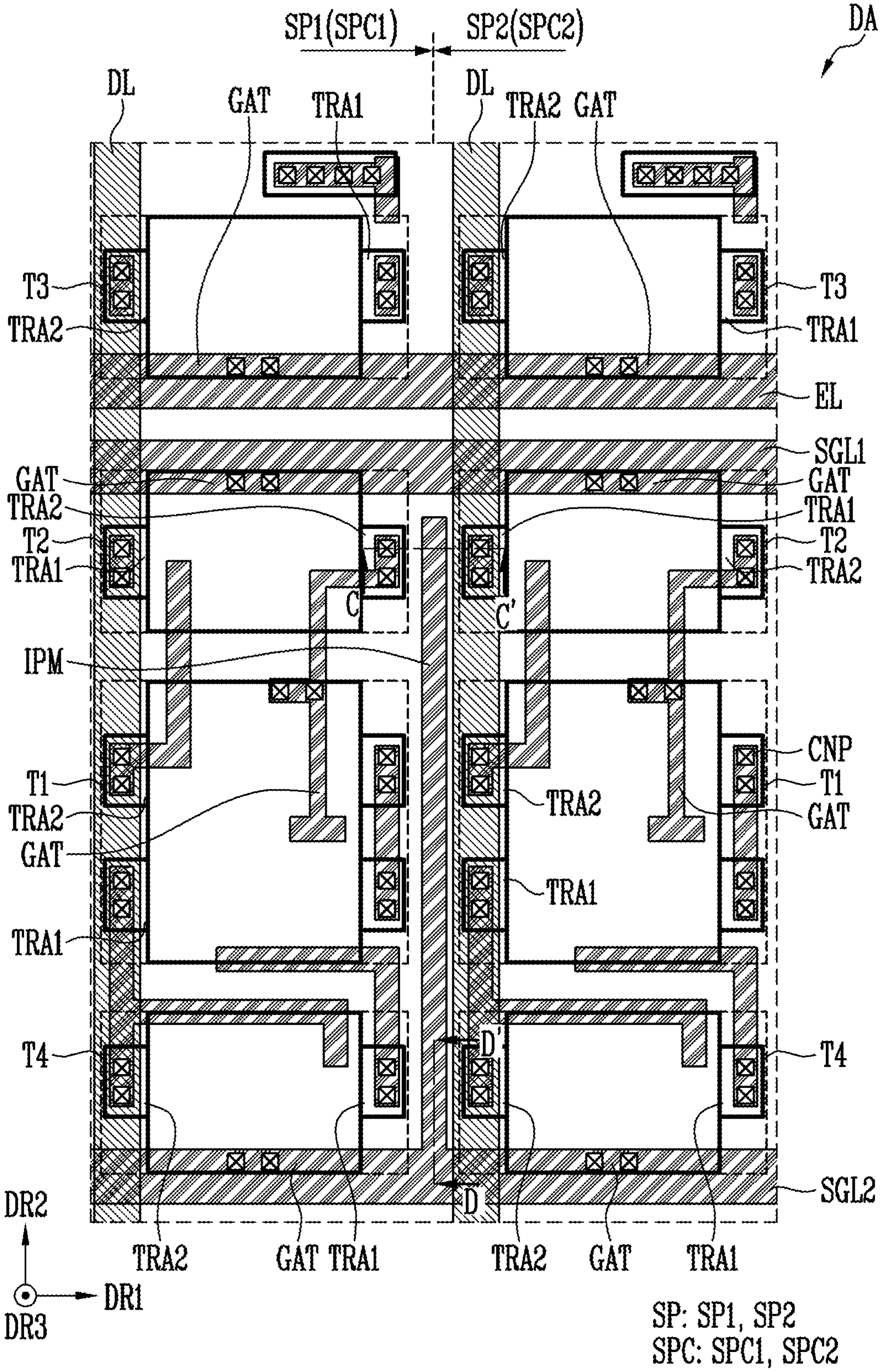
Figure 14:
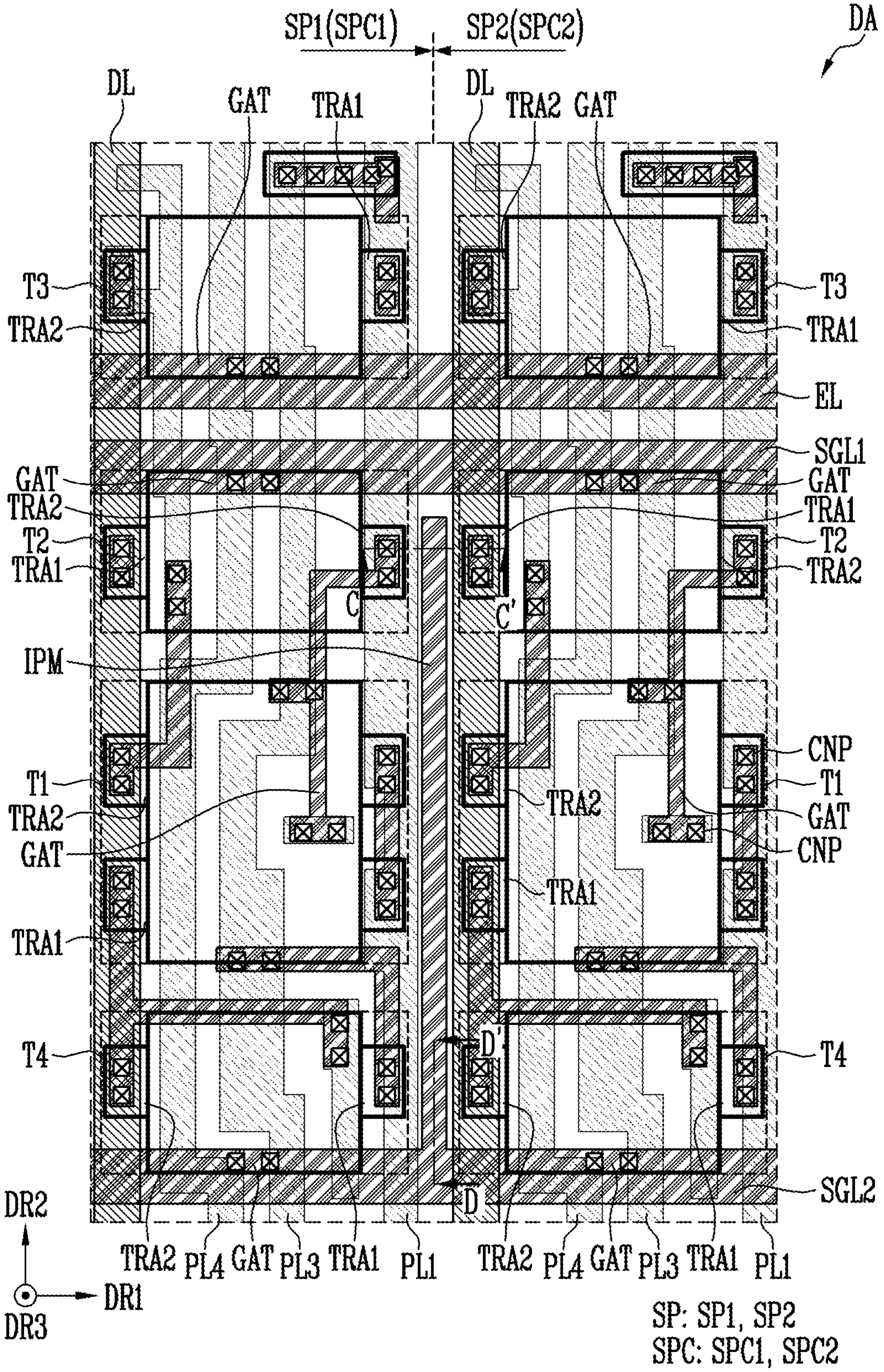
Figure 15:
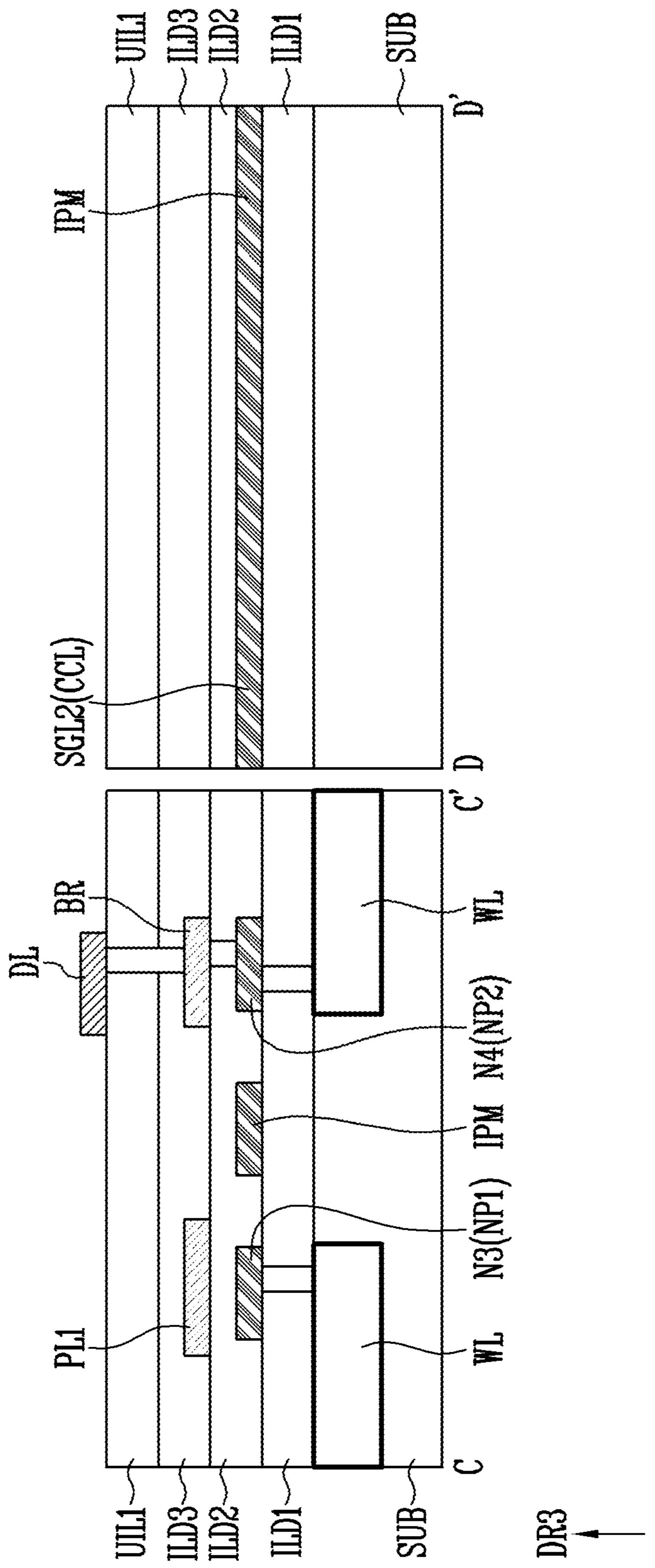

FIGS. 13 to 15 are plan views illustrating the intermediate member IPM, the sub-pixel circuit SPC, and lines electrically connected thereto in accordance with one or more embodiments.

FIG. 13 illustrates the first conductive layer CL1, the contact members CNP, and the data lines DL. FIG. 14 illustrates all of the well WL, the first and second conductive layers CL1 and CL2, the contact members CNP, and the data lines DL. FIGS. 13 and 14 depict the same area in the display area DA. A disposition relationship between the components can be more clearly understood with reference to FIGS. 13 and 14.

FIG. 15 illustrates a schematic sectional view taken along the line C-C' of FIGS. 13 and 14, and a schematic sectional view taken along the line D-D'.

Referring to FIGS. 13 to 15, the display device 100 in accordance with one or more embodiments is different from the display device 100 described above with reference to FIGS. 9 to 12 in that the intermediate member IPM is electrically connected to the second sub-gate line SGL2.

The intermediate member IPM may be electrically connected to the second sub-gate line SGL2 that is the conductive connection line CCL. For example, the intermediate member IPM may be formed by the first conductive layer CL1, and may be integrally formed with the conductive connection line CCL that functions as the second sub-gate line SGL2. For example, the intermediate member IPM may extend in the second direction DR2 from the conductive connection line CCL that extends in the first direction DR1. Also, the intermediate member IPM may be located between the first node portion NP1 and the second node portion NP2 in the same layer. The intermediate member IPM may be formed by the first conductive layer CL1. Accordingly, electrical interference between different nodes may be reduced or prevented, and risks such as crosstalk may be reduced.

Furthermore, in accordance with one or more embodiments, because the intermediate member IPM extends from the second sub-gate line SGL2 located under the fourth transistor T4 to an area adjacent to the second transistor T2, other circuit elements between the first sub-pixel circuit SPC1 and the second sub-pixel circuit SPC2 may also be shielded from each other. For example, the intermediate member IPM may be located between the respective first transistors T1 of the first and second sub-pixel circuits SPC1 and SPC2, and may be positioned between the respective fourth transistors T4.

The display device 100 including an intermediate member IPM formed in accordance with a structure will be described with reference to FIGS. 16 to 18. For the sake of convenience in explanation, descriptions that may overlap the aforementioned content, such as the embodiments described above with reference to FIGS. 9 to 12, will be simplified or omitted.

Figure 16:
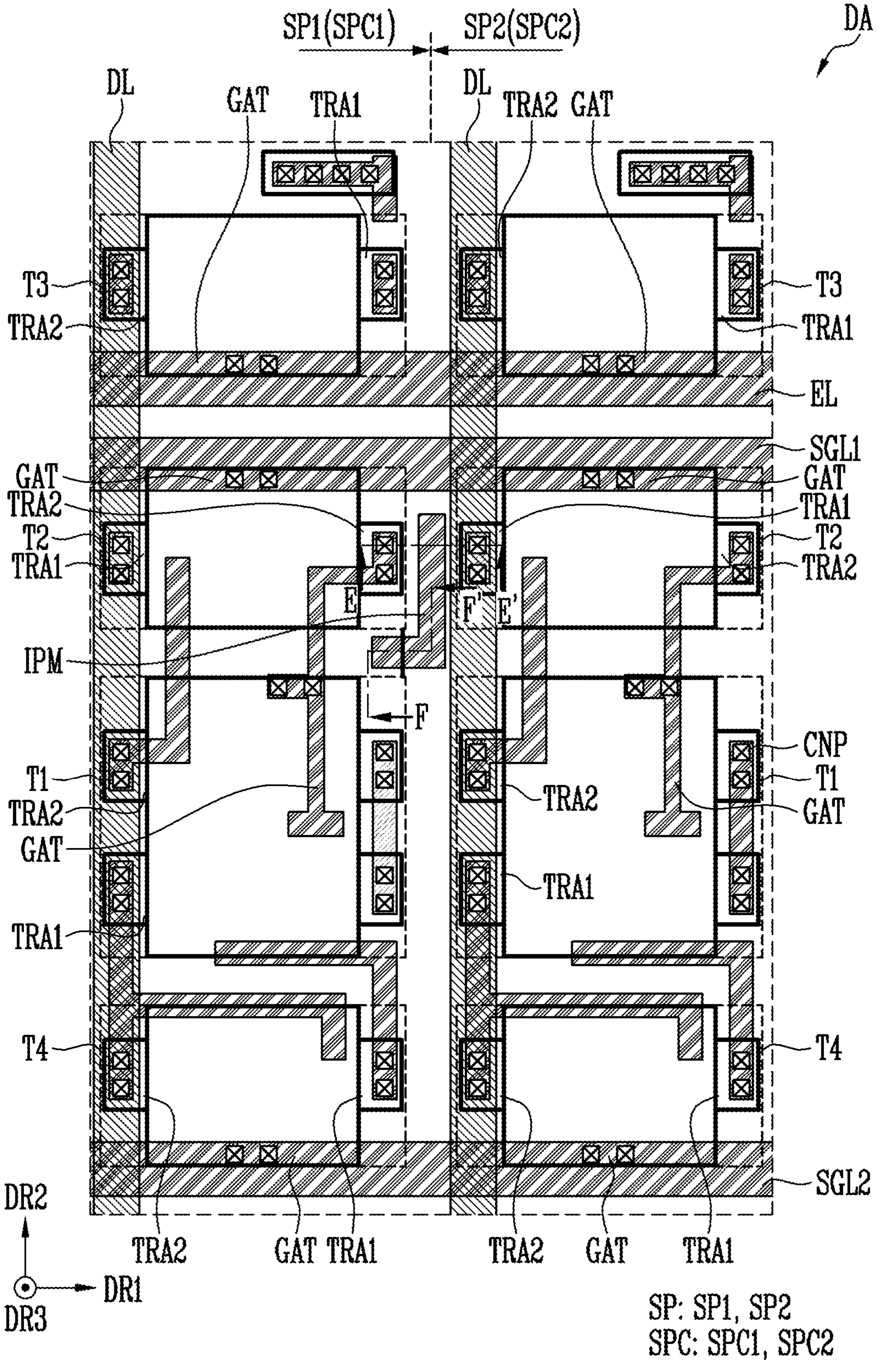
Figure 17:
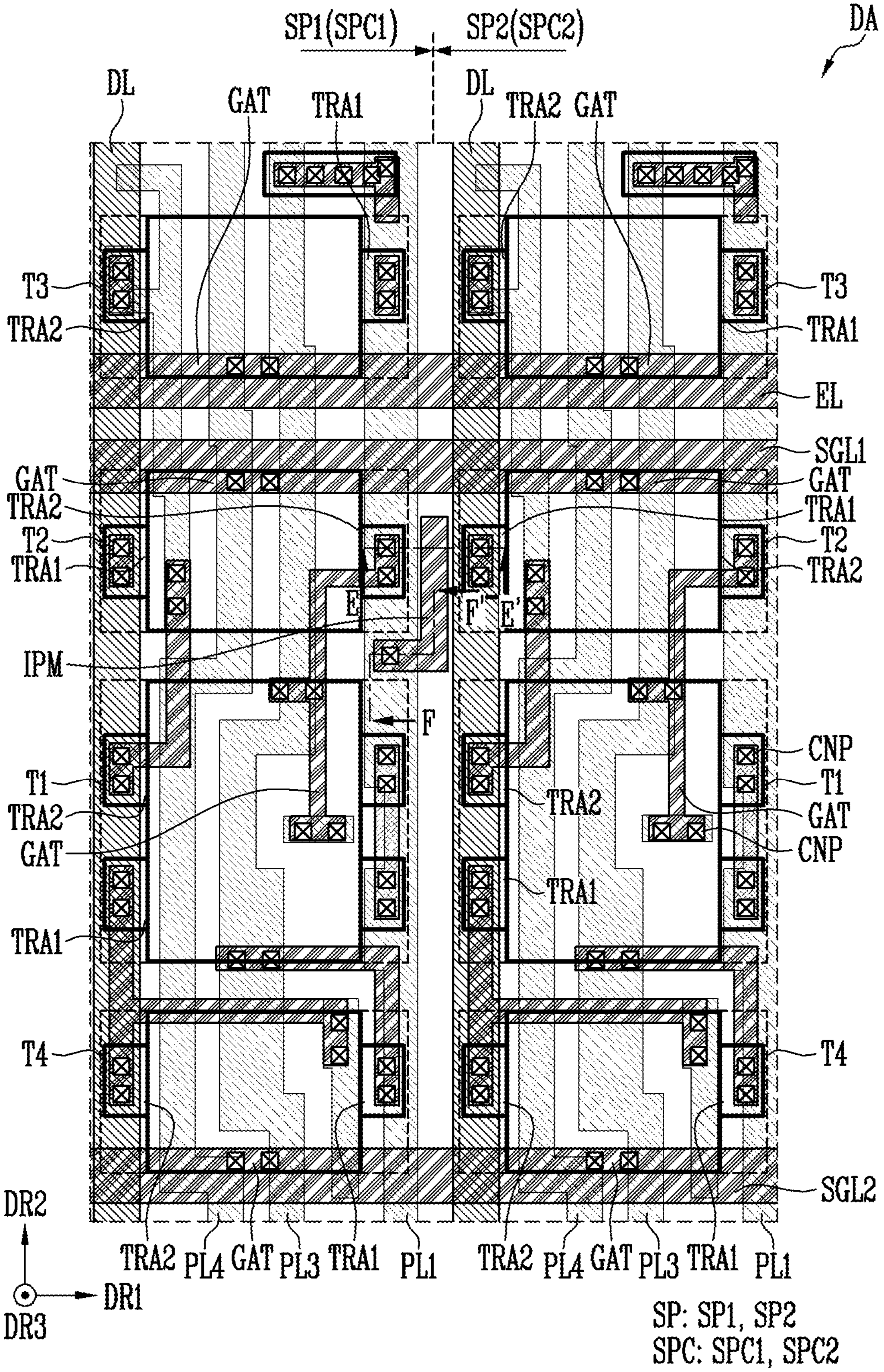
Figure 18:
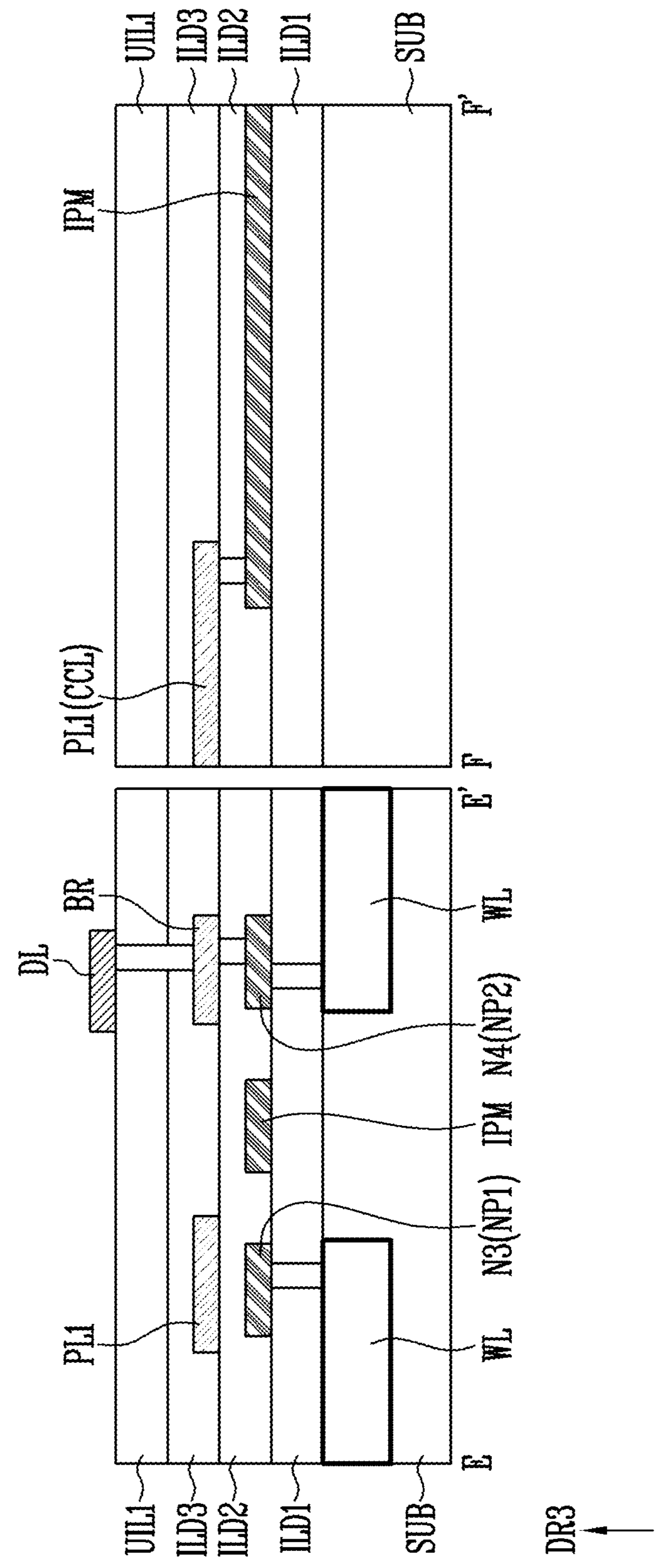

FIGS. 16 to 18 are plan views illustrating the intermediate member IPM, the sub-pixel circuit SPC, and lines electrically connected thereto in accordance with one or more embodiments.

FIG. 16 illustrates the first conductive layer CL1, the contact members CNP, and the data lines DL. FIG. 17 illustrates all of the well WL, the first and second conductive layers CL1 and CL2, the contact members CNP, and the data lines DL. FIGS. 16 and 17 depict the same area in the display area DA. A disposition relationship between the components can be more clearly understood with reference to FIGS. 16 and 17.

FIG. 18 illustrates a schematic sectional view taken along the line E-E' of FIGS. 16 and 17, and a schematic sectional view taken along the line F-F'.

The intermediate member IPM may be electrically connected to the first power line PL1 that is the conductive connection line CCL. For example, the intermediate member IPM may be formed by the first conductive layer CL1, and the first power line PL1 may be formed by the second conductive layer CL2. The intermediate member IPM may be electrically connected, through the corresponding contact member CNP, to the conductive connection line CCL functioning as the first power line PL1. For example, the intermediate member IPM may be electrically connected to a portion of the first power line PL1 of the first sub-pixel circuit SPC1. At least a portion of the intermediate member IPM may be located to extend between the first node portion NP1 and the second node portion NP2.

Also, the intermediate member IPM may be located between the first node portion NP1 and the second node portion NP2 in the same layer. The intermediate member IPM may be formed by the first conductive layer CL1. Accordingly, electrical interference between different nodes may be reduced or prevented, and risks such as crosstalk may be reduced.

Furthermore, in one or more embodiments, because the intermediate member IPM is electrically connected to the first power line PL1 to which a direct current (DC) signal is supplied, the first node portion NP1 and the second node portion NP2 may be more effectively shielded from each other.

In one or more embodiments, the conductive connection line CCL may be any one of the third and fourth power lines PL3 and PL4.

In accordance with one or more embodiments, because the intermediate member IPM is formed, the reliability of electrical signals in the display device 100 may be improved.

Next, the display device 100 including a cover layer CVL in accordance with one or more embodiments will be described with reference to FIGS. 19 to 25. For the sake of convenience in explanation, descriptions of content that overlap those of the embodiments described above will be simplified or omitted.

FIGS. 19 to 25 are schematic views illustrating the display device 100 including the cover layer CVL in accordance with one or more embodiments.

Figure 19:
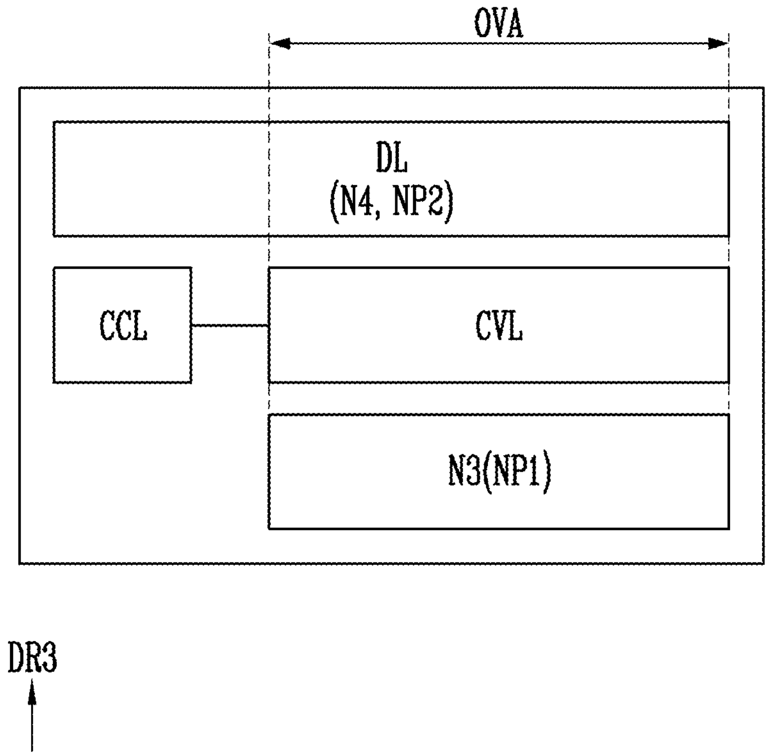
FIGS. 19 to 25 are schematic views illustrating a display device including a cover layer in accordance with one or more embodiments.

FIG. 19 is a schematic block diagram illustrating a disposition relationship between components in a sub-pixel circuit SPC in accordance with one or more embodiments.

Referring to FIG. 19, the display device 100 in accordance with one or more embodiments may include the cover layer CVL.

The cover layer CVL may be formed by a layer between a layer formed by the data line DL and a layer that forms the first node portion NP1. For example, the data line DL may be located above the conductive connection line CCL and the cover layer CVL. At least a portion of the second node portion NP2 may be located above the conductive connection line CCL and the cover layer CVL. At least a portion of the first node portion NP1 may be located below the conductive connection line CCL and the cover layer CVL.

At least a portion of the second node portion NP2 and at least a portion of the first node portion NP1 may overlap each other in an overlapping area OVA, in a plan view.

At least a portion of the cover layer CVL may be interposed between the first node portion NP1 and the second node portion NP2 in the overlapping area OVA. The cover layer CVL may be electrically connected to the conductive connection line CCL.

As described above, in the case where the first node portion NP1 and the second node portion NP2 are excessively adjacent to each other, signals supplied to the respective node portions NP1 and NP2 may interfere with each other, thereby leading to a crosstalk risk causing distortion of a data signal or the like.

In one or more embodiments, because the cover layer CVL, which is configured to receive an electrical signal that is different from signals supplied to the first and second node portions NP1 and NP2, can be located between the first node portion NP1 and the second node portion NP2, the node portions NP1 and NP2 may be appropriately shielded from each other, and risks such as crosstalk may be mitigated, thereby decreasing the likelihood of display quality degradation.

The display device 100 including a cover layer CVL formed in accordance with a structure will be described with reference to FIGS. 20 and 21.

Figure 20:
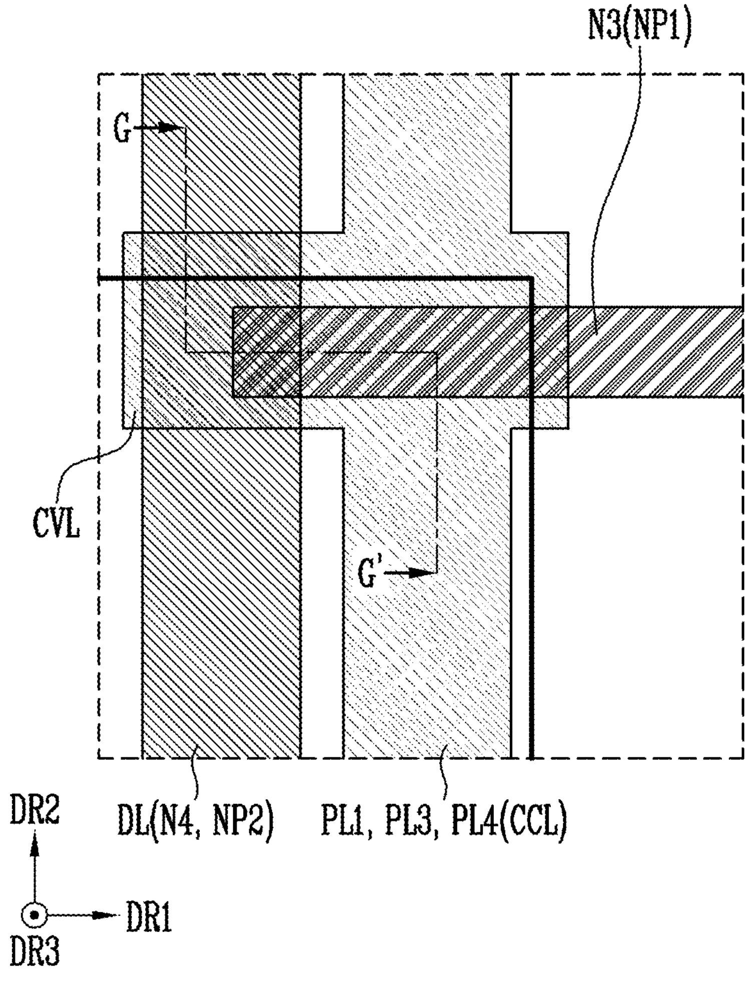

FIG. 20 is a schematic plan view illustrating the cover layer CVL and the adjacent layers in accordance with one or more embodiments. FIG. 21 is a schematic sectional view taken along the line G-G' of FIG. 20.

Figure 21:
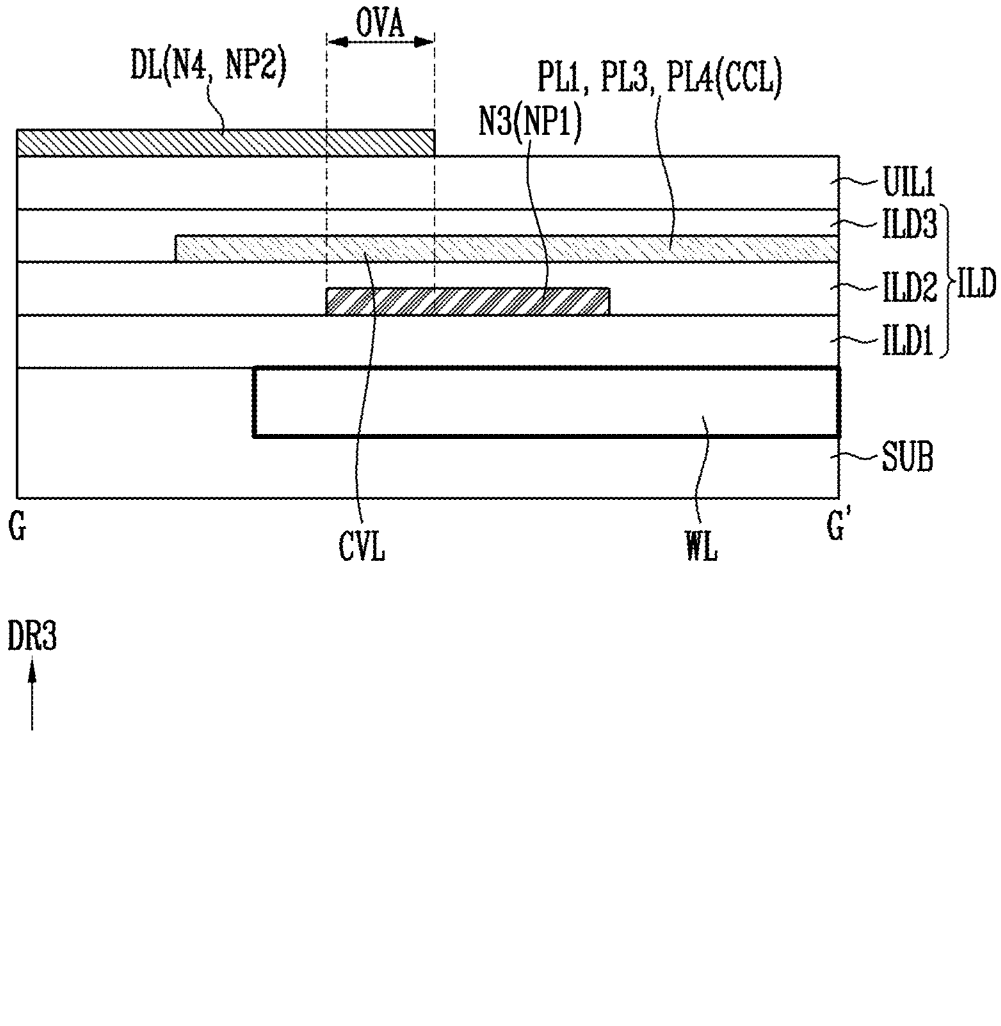

Referring to FIGS. 20 and 21, the conductive connection line CCL may be any one of the first power line PL1, the third power line PL3, and the fourth power line PL4. Consequently, a direct current (DC) signal may be supplied to the conductive connection line CCL.

At least a portion of the first node portion NP1 may be formed by the first conductive layer CL1, and may extend in the first direction DR1. The conductive connection line CCL may be formed by the second conductive layer CL2, and may extend in the second direction DR2. The data line DL may be formed by the second conductive structure layer M2, and may extend in the second direction DR2.

The data line DL and the first node portion NP1 formed by the first conductive layer CL1 may overlap each other in the overlapping area OVA.

In one or more embodiments, the cover layer CVL may be formed by the second conductive structure layer M2. The cover layer CVL may be integrally formed with the conductive connection line CCL, and may be electrically connected to the conductive connection line CCL.

Also, the cover layer CVL may be supplied with a DC signal, and may be interposed between the first node portion NP1 and the second node portion NP2. Accordingly, even when the first node portion NP1 and the second node portion NP2 overlap each other in a plan view, risks such as crosstalk may be mitigated by the shielding structure formed by the cover layer CVL.

The display device 100 including a cover layer CVL formed in accordance with a structure will be described with reference to FIGS. 22 to 23.

Figure 22:
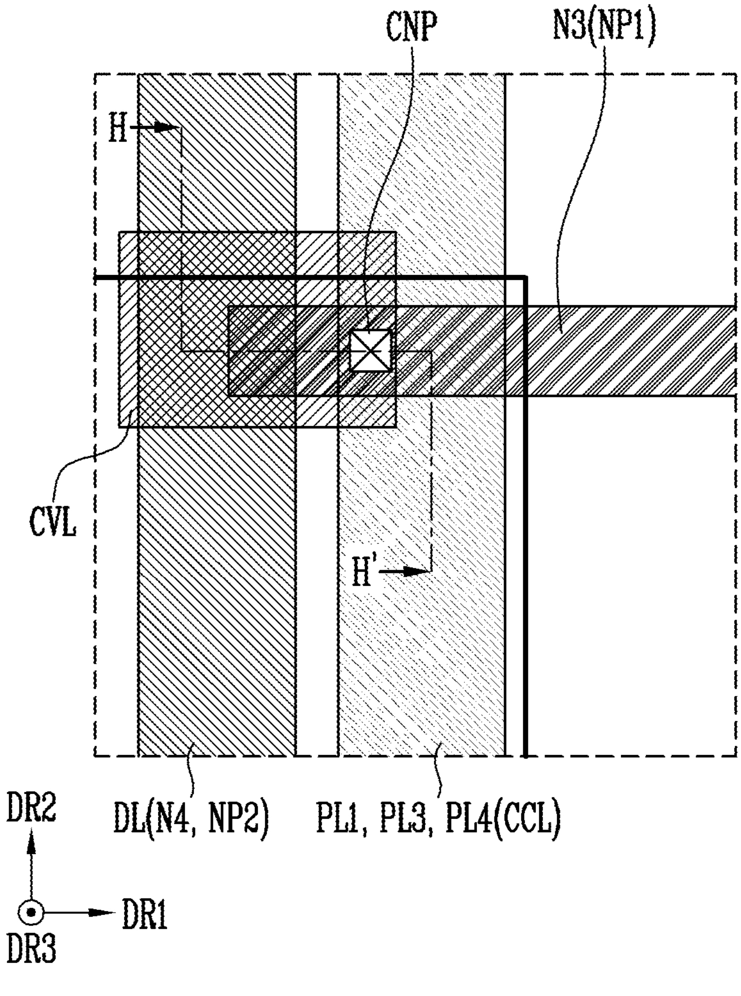

FIG. 22 is a schematic plan view illustrating the cover layer CVL and the adjacent layers in accordance with one or more embodiments. FIG. 23 is a schematic sectional view taken along the line H-H' of FIG. 22.

Figure 23:
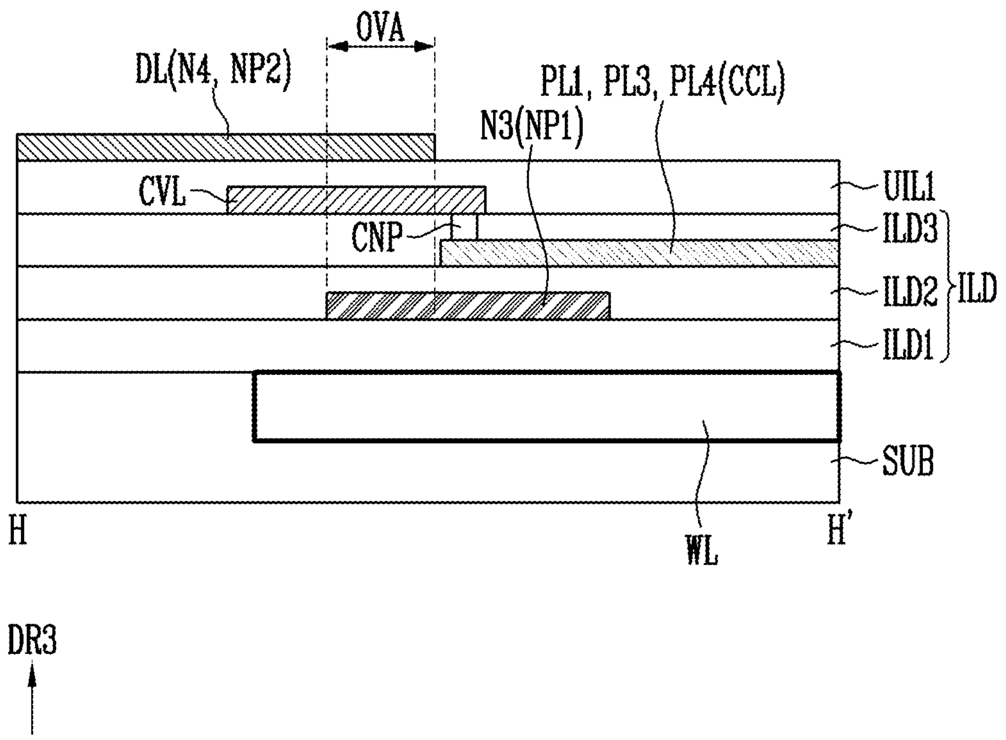

The display device 100 illustrated in FIGS. 22 and 23 is different from the display device 100 described above with reference to FIGS. 20 and 21 in that the cover layer CVL and the conductive connection line CCL are located in different layers.

In one or more embodiments, the cover layer CVL may be formed by the first conductive structure layer M1. The cover layer CVL may be electrically connected to the conductive connection line CCL through a contact member CNP passing through the third inter layer dielectric ILD3.

Also, similar to the aforementioned embodiments, the cover layer CVL, which is located in a layer that is different from that of the conductive connection line CCL, may be supplied with a DC signal, and may be interposed between the first node portion NP1 and the second node portion NP2. Accordingly, even when the first node portion NP1 and the second node portion NP2 overlap each other in a plan view, risks such as crosstalk may be mitigated by the shielding structure formed by the cover layer CVL.

The display device 100 including a cover layer CVL formed in accordance with a structure will be described with reference to FIGS. 24 and 25.

Figure 24:
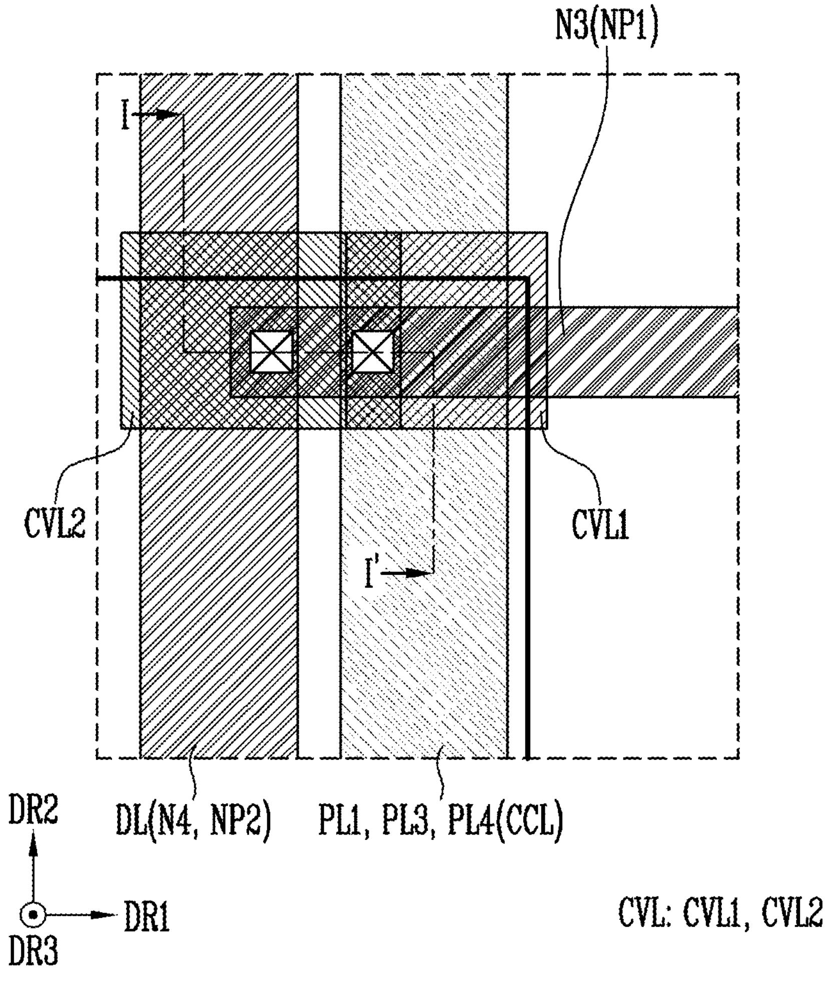

FIG. 24 is a schematic plan view illustrating the cover layer CVL and the adjacent layers in accordance with one or more embodiments. FIG. 25 is a schematic sectional view taken along the line I-I' of FIG. 24.

Figure 25:
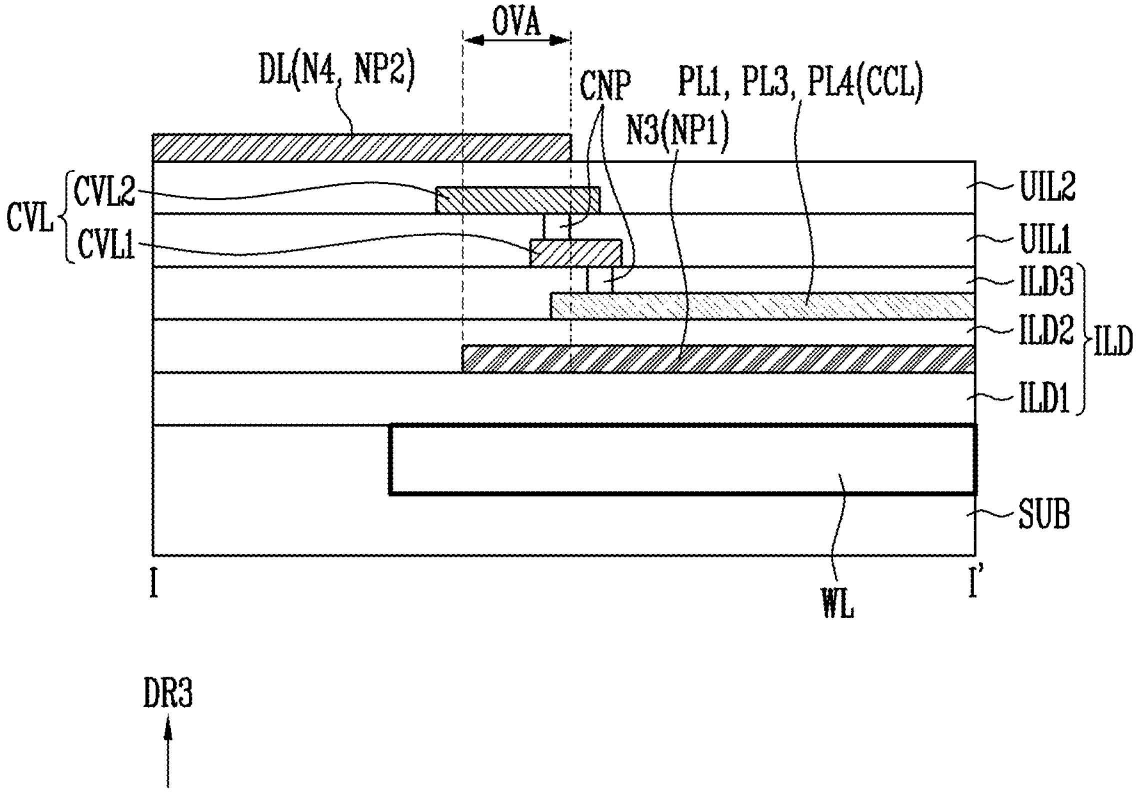

The display device 100 illustrated in FIGS. 24 and 25 is different from the display device 100 described above with reference to FIGS. 20 and 21 in that the cover layer CVL includes a first cover layer CVL1 and a second cover layer CVL2 located in different layers.

In one or more embodiments, the data line DL may be formed by the third conductive structure layer M3. In one or more embodiments, the first cover layer CVL1 may be formed by the first conductive structure layer M1. The second cover layer CVL2 may be formed by the second conductive structure layer M2. The second cover layer CVL2 may be electrically connected to the first cover layer CVL1 through a contact member CNP passing through the first upper insulating layers UIL1. The first cover layer CVL1 may be electrically connected to the conductive connection line CCL through a contact member CNP passing through the third inter layer dielectric ILD3.

Also, similar to the aforementioned embodiments, the cover layer CVL including the first cover layer CVL1 and the second cover layer CVL2 may be supplied with a DC signal, and may be interposed between the first node portion NP1 and the second node portion NP2. Accordingly, even when the first node portion NP1 and the second node portion NP2 overlap each other in a plan view, risks such as crosstalk may be mitigated by the shielding structure formed by the cover layer CVL.

Figure 26:
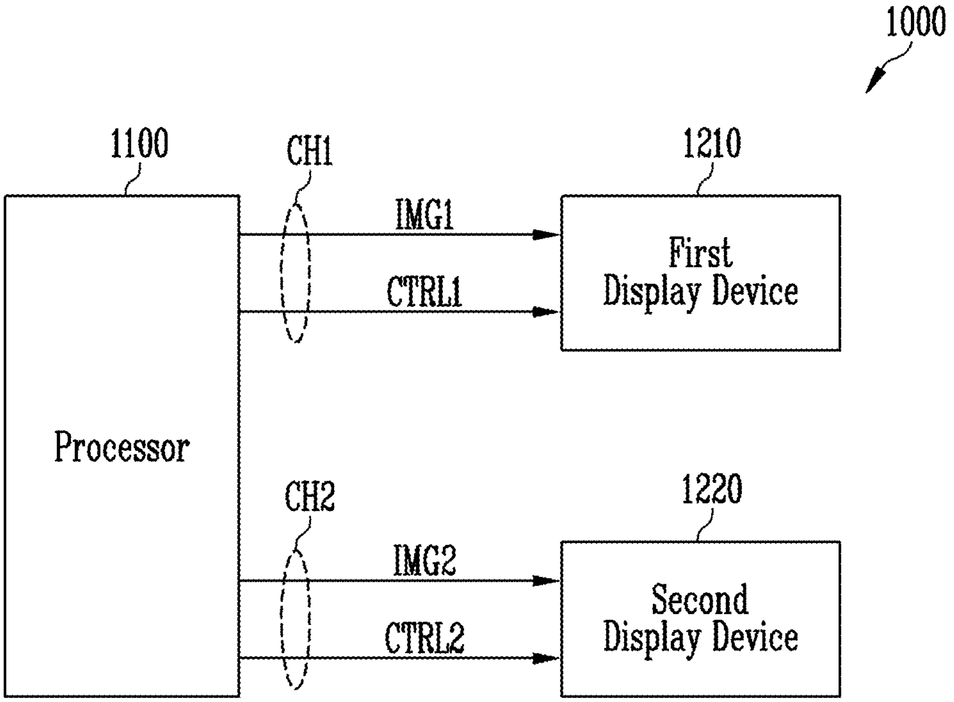
FIG. 26 is a block diagram illustrating one or more embodiments of a display system.

FIG. 26 is a block diagram illustrating one or more embodiments of a display system 1000.

Referring to FIG. 26, the display system 1000 may include a processor 1100, and one or more display devices 1210 and 1220.

The processor 1100 may perform various tasks and operations. In embodiments, the processor 1100 may include an application processor, a graphic processor, a microprocessor, a central processing unit (CPU), and so on. The processor 1100 may be connected to the other components of the display system 1000 through a bus system to control the components.

In FIG. 26, there is illustrated the case where the display system 1000 includes the first and second display devices 1210 and 1220. The processor 1100 may be connected to the first display device 1210 through a first channel CH1, and may be connected to the second display device 1220 through a second channel CH2.

The processor 1100 may transmit first image data IMG1 and a first control signal CTRL1 to the first display device 1210 through the first channel CH1. The first display device 1210 may display an image based on the first image data IMG1 and the first control signal CTRL1. The first display device 1210 may be configured in the same manner as the display device 100 described with reference to FIG. 1. In this case, the first image data IMG1 and the first control signal CTRL1 may be provided as the input image data IMG and the control signal CTRL of FIG. 1, respectively.

The processor 1100 may transmit second image data IMG2 and a second control signal CTRL2 to the second display device 1220 through the second channel CH2. The second display device 1220 may display an image based on the second image data IMG2 and the second control signal CTRL2. The second display device 1220 may be configured in the same manner as the display device 100 described with reference to FIG. 1. In this case, the second image data IMG2 and the second control signal CTRL2 may be provided as the input image data IMG and the control signal CTRL of FIG. 1, respectively.

The display system 1000 may include computing systems that provide an image display function used for portable electronic devices, such as a portable computer, a mobile phone, a smart phone, a tablet personal computer (tablet PC), a smart watch, a watch phone, a portable multimedia player, a navigation system, and an ultra-mobile personal computer (UMPC). Furthermore, the display system 1000 may include at least one of a head-mounted display (HMD), a virtual reality (VR) device, a mixed reality (MR) device, and/or an augmented reality (AR) device.

Figure 27:
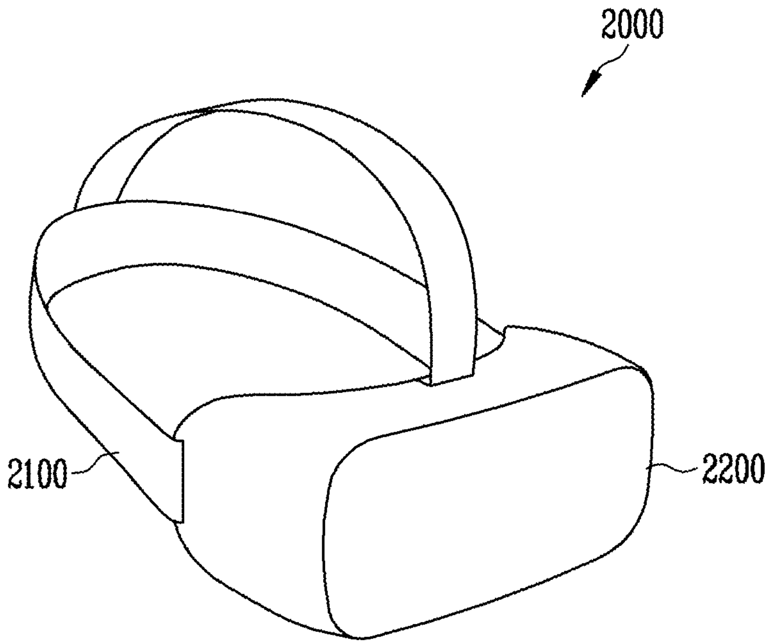
FIG. 27 is a perspective diagram illustrating an application example of the display system of FIG. 26.

FIG. 27 is a perspective diagram illustrating an application example of the display system 1000 of FIG. 26.

Referring to FIG. 27, the display system 1000 of FIG. 26 may be applied to a head-mounted display device 2000. The head-mounted display device 2000 may be a wearable electronic device, which can be worn on the head of the user.

The head-mounted display device 2000 may include a head-mounted band 2100 and a display device reception casing 2200. The head-mounted band 2100 may be connected to the display device reception casing 2200. The head-mounted band 2100 may include a horizontal band and/or a vertical band to fasten the head-mounted display device 2000 to the head of the user. The horizontal band may enclose the sides of the head of the user, and the vertical band may enclose the top of the head of the user. However, the embodiments are not limited to the aforementioned example. For example, the head-mounted band 2100 may be implemented in the form of eyeglass frames, a helmet, and so on.

The display device reception casing 2200 may receive the first and second display devices 1210 and 1220 of FIG. 26. The display device reception casing 2200 may further receive the processor 1100 of FIG. 26.

Figure 28:
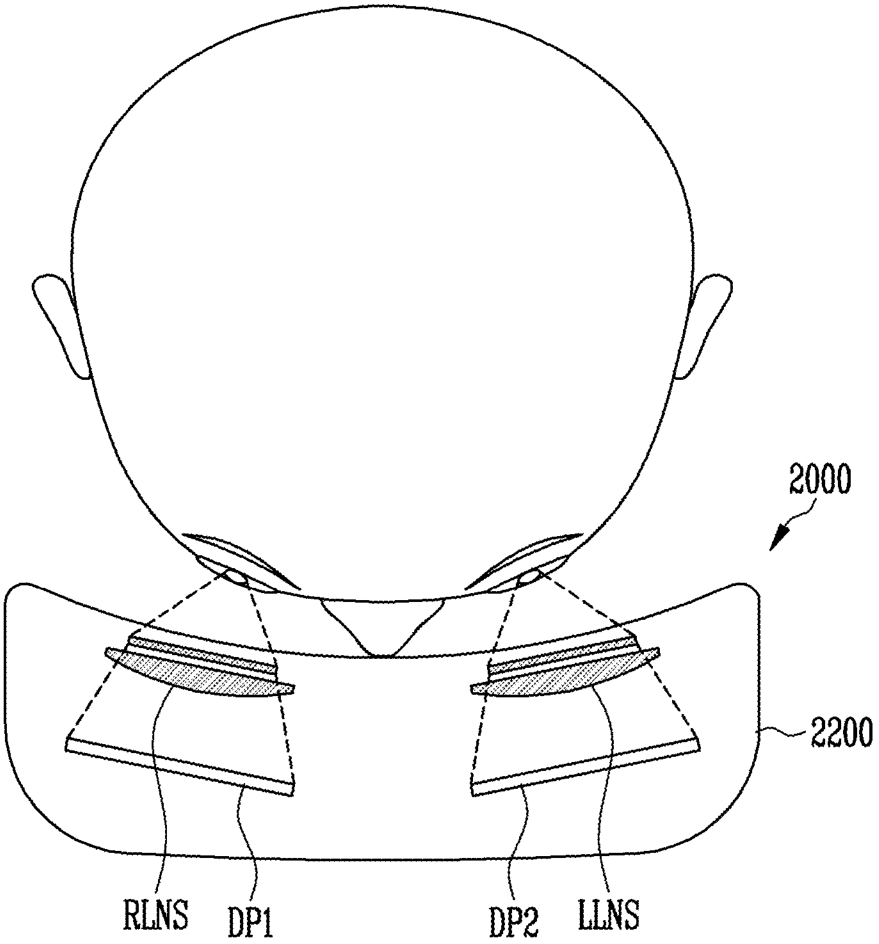
FIG. 28 is a diagram illustrating a head-mounted display device of FIG. 27 that is worn on a user's head.

FIG. 28 is a diagram illustrating a head-mounted display device 2000 of FIG. 27 that is worn on a user's head.

Referring to FIG. 28, the first display panel DP1 of the first display device 1210 and the second display panel DP2 of the second display device 1220 are located in the head-mounted display device 2000. The head-mounted display device 2000 may further include one or more lenses LLNS and RLNS.

In the display device reception casing 2200, the right-eye lens RLNS may be positioned between the first display panel DP1 and the right eye of the user. In the display device reception casing 2200, the left-eye lens LLNS may be positioned between the second display panel DP2 and the left eye of the user.

An image outputted from the first display panel DP1 can be viewed by the right eye of the user through the right-eye lens RLNS. The right-eye lens RLNS may refract light emitted from the first display panel DP1 toward the right eye of the user. The right-eye lens RLNS may perform an optical function to adjust a viewing distance between the first display panel DP1 and the right eye of the user.

An image outputted from the second display panel DP2 can be viewed by the left eye of the user through the left-eye lens LLNS. The left-eye lens LLNS may refract light emitted from the second display panel DP2 toward the left eye of the user. The left-eye lens LLNS may perform an optical function to adjust a viewing distance between the second display panel DP2 and the left eye of the user.

In embodiments, each of the right-eye lens RLNS and the left-eye lens LLNS may include an optical lens having a pancake-shaped cross-section. In embodiments, each of the right-eye lens RLNS and the left-eye lens LLNS may include a multi-channel lens including sub-areas having different optical characteristics. In this case, each display panel may output images respectively corresponding to sub-areas of the multi-channel lens. The output images may be viewed to the user through the corresponding sub-areas.

Embodiments of the present disclosure may provide a display device with improved reliability of electrical signals, thereby reducing risks such as crosstalk between the signals.

Embodiments of the present disclosure may provide a display device that has enhanced display quality with improved reliability, and that is capable of having high-resolution characteristics.

Although embodiments and application examples have been described, it should be noted that other embodiments and modifications may be derived from the disclosure provided. Accordingly, the concepts of the present disclosure are not limited to the foregoing embodiments, but rather to the broader scope of the presented claims and various obvious modifications and equivalent arrangements.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims, with functional equivalents thereof to be included therein.

What is claimed is:

1. A display device comprising:
- a substrate;
- sub-pixels having a first sub-pixel and a second sub-pixel adjacent to each other;
- a pixel-circuit layer comprising:
  - a sub-pixel circuit comprising a first sub-pixel circuit in the first sub-pixel and a second sub-pixel circuit in the second sub-pixel above the substrate, and the first sub-pixel circuit and the second sub-pixel each comprising:
    - a driving transistor; and
    - a switching transistor having a first electrode electrically connected to a gate electrode of the driving transistor through a first node portion, and a second electrode electrically connected to a data line through a second node portion; and an intermediate member between the first node portion of the first sub-pixel circuit and the second node portion of the second sub-pixel circuit in a plan view; and a light-emitting element above the pixel-circuit layer, and electrically connected to the sub-pixel circuit.

2. The display device according to claim 1, wherein the first sub-pixel circuit and the second sub-pixel circuit are adjacent to each other in a first direction, wherein, in the first sub-pixel circuit and in the second sub-pixel circuit, the driving transistor and the switching transistor are adjacent to each other in a second direction that is different from the first direction, wherein the driving transistor of the first sub-pixel circuit and the driving transistor of the second sub-pixel circuit face each other in the first direction, and wherein the switching transistor of the first sub-pixel circuit and the switching transistor of the second sub-pixel circuit face each other in the first direction.

3. The display device according to claim 2, wherein the intermediate member extends in the second direction.

4. The display device according to claim 2, further comprising a conductive connection line electrically connected to the intermediate member, and configured to supply an electrical signal that is different from electrical signals configured to be respectively received by the first node portion and the second node portion.

5. The display device according to claim 2, wherein the pixel-circuit layer comprises conductive layers and conductive structure layers above the substrate and respectively comprising the sub-pixel circuit, the data line, and the intermediate member.

6. The display device according to claim 5, wherein the intermediate member is at a same layer as the first node portion and the second node portion.

7. The display device according to claim 6, wherein the conductive layers comprise:

a first conductive layer comprising the intermediate member, at least a portion of the first node portion, and at least a portion of the second node portion; and a second conductive layer above the first conductive layer and comprising a bridge layer, wherein the second node portion is electrically connected to the data line through the bridge layer.

8. The display device according to claim 7, wherein the pixel-circuit layer further comprises a first power line configured to receive a first power voltage, a second power line configured to receive a second power voltage, a third power line configured to receive an initialization voltage, a fourth power line, a first sub-gate line electrically connected to a gate electrode of the switching transistor, a second sub-gate line, and an emission control line, wherein the sub-pixel circuit further comprises:

a third transistor connected between a first node and the first power line, and comprising a gate electrode electrically connected to the emission control line; and a fourth transistor connected between a second node and the third power line, and comprising a gate electrode electrically connected to the second sub-gate line, wherein the driving transistor is connected between the first node and the second node, and wherein the light-emitting element is connected between the second node and the second power line.

9. The display device according to claim 8, wherein the intermediate member is electrically connected to, and extending in a different direction than, the first sub-gate line.

10. The display device according to claim 9, wherein the first conductive layer comprises the first sub-gate line that is integral with the intermediate member.

11. The display device according to claim 8, wherein the intermediate member is electrically connected to, and extends in a different direction than, the second sub-gate line.

12. The display device according to claim 11, wherein the intermediate member overlaps the driving transistor and the fourth transistor in the first direction.

13. The display device according to claim 8, wherein the intermediate member is configured to receive a direct current (DC) signal.

14. The display device according to claim 13, wherein the intermediate member is electrically connected to the first power line.

15. The display device according to claim 8, wherein the sub-pixel circuit comprises:

a first capacitor connected between the first node and the first node portion;

a second capacitor connected between the first node portion and the fourth power line, which is configured to receive a reference voltage; and a third capacitor connected between the second node and the first node portion, wherein the conductive structure layers form capacitance for the first capacitor, the second capacitor, and the third capacitor.

16. An electronic device comprising a display device comprising:

a substrate;

sub-pixels having a first sub-pixel and a second sub-pixel adjacent to each other;

a pixel-circuit layer comprising:

a sub-pixel circuit comprising a first sub-pixel circuit in the first sub-pixel and a second sub-pixel circuit in the second sub-pixel above the substrate, and the first sub-pixel circuit and the second sub-pixel circuit comprising:

a driving transistor; and a switching transistor having a first electrode electrically connected to a gate electrode of the driving transistor through a first node portion, and a second electrode electrically connected to a data line through a second node portion; and an intermediate member between the first node portion of the first sub-pixel circuit and the second node portion of the second sub-pixel circuit in a plan view;

and a light-emitting element above the pixel-circuit layer, and electrically connected to the sub-pixel circuit.

* * * * *